(12) United States Patent
Morisada

(10) Patent No.: US 7,417,868 B2
(45) Date of Patent: Aug. 26, 2008

(54) CASING UNIT FOR ELECTRONIC DEVICE

(75) Inventor: Kazutoshi Morisada, Handa (JP)

(73) Assignee: DENSO CORPORATION, Kariya (JP)

( * ) Notice: Subject to any disclaimer, the term of this patent is extended or adjusted under 35 U.S.C. 154(b) by 269 days.

(21) Appl. No.: 11/142,751

(22) Filed: Jun. 2, 2005

(65) Prior Publication Data

US 2005/0270753 A1    Dec. 8, 2005

(30) Foreign Application Priority Data

Jun. 2, 2004   (JP)   ............................. 2004-164851
Sep. 30, 2004  (JP)   ............................. 2004-287925

(51) Int. Cl.
*H05K 7/14* (2006.01)
(52) U.S. Cl. ...................... 361/756; 361/752; 361/796; 361/741; 361/802
(58) Field of Classification Search .................. 174/50, 174/520; 361/741, 756, 752, 759, 801, 802, 361/796, 736
See application file for complete search history.

(56) References Cited

U.S. PATENT DOCUMENTS 4,558,396 A * 12/1985 Kawabata et al. ........... 361/681

6,020,824 A * 2/2000 Tamura et al. ........... 340/815.5
6,178,094 B1 * 1/2001 Hakozaki .................... 361/796
6,484,360 B1 * 11/2002 DeBartolo et al. .......... 16/95 R
6,852,924 B2 * 2/2005 Lessard ....................... 174/50
7,140,885 B2 * 11/2006 Kitamura ................... 439/76.1

FOREIGN PATENT DOCUMENTS

JP    9-74291    3/1997

* cited by examiner

*Primary Examiner*—Dean A. Reichard
*Assistant Examiner*—Dameon E Levi
(74) *Attorney, Agent, or Firm*—Posz Law Group, PLC

(57) ABSTRACT

In a casing unit for accommodating a printed circuit board, a case has a plurality of walls, one of the walls being partially or entirely open to form an open surface through which the board is inserted into the case. Guides, secured on side walls, comprise two guide protruding members each formed to protrude from the side walls and positioned to partly contact both sides of the board to be inserted into the case, whereby the board is positioned in a planar direction thereof. A cover, applied to the case to cover the open surface of the case, comprises a vertically positioning member positioning the board in a vertical direction, when the cover is applied to the case to cover the open surface, by pinching an end of the board in the vertical direction. The end of the board is located in the open surface of the case.

46 Claims, 11 Drawing Sheets

CASING UNIT FOR ELECTRONIC DEVICE

CROSS REFERENCES TO RELATED APPLICATIONS

The present application relates to and incorporates by reference Japanese Patent application Nos. 2004-164851 filed on Jun. 2, 2004 and 2004-287925 filed on Sep. 30, 2004.

BACKGROUND OF THE INVENTION

1. Field of the Invention

The present invention relates to a casing unit for electronic devices wherein a printed circuit board, on which electronic component parts are mounted, is supported in an internal space defined by a case and a cover.

2. Description of the Related Art

In electronic apparatuses, it is frequent that printed circuit boards are arranged in cases for protection, shielding against noise, or other influences. In order to achieve such purposes, there have been various types of cases. Electronic component parts are mounted on a printed circuit board enclosed by a case. One conventional structure for an electronic device, which is categorized into the above case, is disclosed in, for instance, Japanese Patent Provisional Laid-open Publication No. 9-74291. That is, a printed circuit board on which electronic component parts are mounted is supported in an internal space cooperatively defined by a case and a cover.

To be specific, with the casing structure disclosed in the above publication, a case (body section) has both side surfaces formed with support portions (in engagement slits), which support both side surfaces of a printed circuit board (substrate) to cause the printed circuit board to be pressed against a rearward area of the case and a cover (lid) to be flexed under a status wherein the cover is coupled to the case, and press portions (protrusions) adapted to cause the printed circuit board to be brought into pressurized contact with the support portions. Thus, the printed circuit board is pressed and flexed downward by the actions of the support portions and fixed in place due to the resulting reaction force.

SUMMARY OF THE INVENTION

However, with the casing structure formed in a configuration, set forth above, wherein the printed circuit board is pressed to cause the same to be flexed using the resulting reaction force, strain occurs in the printed circuit board, resulting in a difficulty for electronic component parts to be mounted in areas where strain occurs. Accordingly, it becomes hard to improve mounting density of the printed circuit board with a resultant difficulty in miniaturizing the printed circuit board (physical size of the electronic device).

The present invention has been completed with the above view in mind and has an object to provide a casing structure for an electronic device that enables reduction in stress born by a printed circuit board.

The present invention, described below, relates to a casing structure of an electronic device, comprised of a printed circuit board on which electronic component parts are mounted, a case formed in a box-like configuration with its one end being opened and having inner both side surfaces formed with guides through which the printed circuit board is inserted, and a cover that closes an open end of the case, in which the printed circuit board is held in an internal space defined by the case and the cover.

According to an essential aspect of the present embodiment, there is provided a casing unit for accommodating a printed circuit board on which electronic component parts are mounted, comprising: a case having a plurality of walls, one of the walls being partially or entirely open to form an open surface through which the printed circuit board is inserted into the case and remaining two side walls of the walls each intersecting the open surface; a guide member composed of two guides respectively secured on the side walls inside the case, the two guides providing a path therealong to guide the printed circuit board to be inserted into the case; a cover applied to the case to cover the open surface of the case; a first positioning member positioning, in a planar direction along the printed circuit board, the printed circuit board inserted in the case through the open surface along the path, by coming in contact with part of each side of the printed circuit board, the sides of the printed circuit board being along the path; and a second positioning member positioning the printed circuit board in a vertical direction perpendicular to the planar direction by coming into contact with at least one of an upper surface and a lower surface of the printed circuit board in the vertical direction.

In addition, the above essential aspect of the present invention includes various example modes which are still according to the present invention.

One example mode is to provide a casing unit for accommodating a printed circuit board on which electronic component parts are mounted, comprising: a case having a plurality of walls, one of the walls being partially or entirely open to form an open surface through which the printed circuit board is inserted into the case and remaining two side walls of the walls each intersecting the open surface; guides, which are secured on the side walls inside the case and provide a path therealong to guide the printed circuit board to be inserted into the case, comprising two guide protruding members each formed to protrude from the side walls and positioned to partly come in contact with both sides of the printed circuit board to be inserted into the case along the path, the sides being along the path, whereby the printed circuit board is positioned in a planar direction of the printed circuit board; and a cover, which is applied to the case to cover the open surface of the case, comprising a vertically positioning member positioning the printed circuit board in a vertical direction perpendicular to the planar direction, when the cover is applied to the case to cover the open surface, by pinching an end of the printed circuit board in the vertical direction, the end of the printed circuit board being located in the open surface of the case in which the printed circuit board is positioned in the planar direction by the guide protruding members.

Preferably, each of the guide protruding members comprises a slope sloped to gradually come close to each of the sides of the printed circuit board as the insertion of the printed circuit board advances along the path and a retainer formed to be continuous from the slope, both of the retainers of the guide protruding members being faced to each other to have a distance therebetween which is substantially equal to a width of the printed circuit board.

Still preferably, the vertically positioning member has a recess to pinch the end of the printed circuit board, the recess being open to the case when the cover is applied to the case and having a gap length substantially equal to a thickness of the printed circuit board.

According to this configuration, the printed circuit board is positioned in terms of the planar direction thereof by the first guide protruding members disposed on the guide portions, formed on both side surfaces of the case, in a width substantially equal to a width of the printed circuit board and positioned in terms of the vertical direction by the vertically positioning members with a width substantially equal to the width of the printed circuit board. The first guide protruding members and the vertically positioning members are formed in structures to guide the printed circuit board to a given position at which the printed circuit board is retained. Therefore, the printed circuit board can be fixed in place with no external pressure positively exerted thereto as required in the related art, enabling reduction in stress occurring in the printed circuit board.

In addition, the guides are configured in a way to extend from the open end toward the rear area of the case with a width and thickness greater than the width and thickness of the printed circuit board, providing a capability for the printed circuit board to be easily inserted to the circuit.

It may also be sufficed for the first guide protruding members to be formed on at least the both side surfaces of the case and the present invention is not limited to the number of the first guide protruding members to be provided. Thus, the number of the first guide protruding members to be provided may differ depending on a length and thickness of the printed circuit board.

A second example mode is to provide a casing unit for accommodating a printed circuit board on which electronic component parts are mounted, comprising: a case having a plurality of walls, one of the walls being partially or entirely open to form an open surface through which the printed circuit board is inserted into the case and remaining two side walls of the walls each intersecting the open surface; guides secured on the side walls inside the case to provide a path guiding the printed circuit board to be inserted into the case, comprising a pair of first guide protruding members each formed to protrude from the side walls and positioned to partly come in contact with both sides of the printed circuit board to be inserted into the case along the path, the sides being along the path, whereby the printed circuit board is positioned in a planar direction of the printed circuit board, and a pair of second protruding members each formed to protrude from one of an upper and lower surfaces of each of the guides and positioned to partly come in contact with at least one of an upper surface and a lower surface of the printed circuit board to be inserted into the case along the path, whereby the printed circuit board is positioned in a vertical direction perpendicular to the planar direction; and a cover to be applied to the case to cover the open surface of the case.

It is preferred that each of the first guide protruding members comprises a first slope sloped to gradually come close to each of the sides of the printed circuit board as the insertion of the printed circuit board advances along the path and a first retainer formed to be continuous from the first slope, both of the first retainers of the first guide protruding members being faced to each other to have a distance therebetween which is substantially equal to a width of the printed circuit board.

It is still preferred that each of the second guide protruding members comprises a second slope sloped to gradually come close to at least one of the upper and lower surfaces of the printed circuit board as the insertion of the printed circuit board advances along the path and a second retainer formed to be continuous from the second slope, both of the second retainers of the second guide protruding members being faced to each other to have a distance therebetween which is substantially equal to a thickness of the printed circuit board.

Thus, as to the planar direction, a printed circuit board can be positioned by the pair of first guide protruding members, while as to the vertical direction perpendicular to the board, the board can be positioned by the pair of second protruding members. In additionally, by those pairs of first and second protruding members, the printed circuit board can be guided to a predetermined position in the case and can be held there. Accordingly, without giving pressure to a printed circuit board actively, the board can surely be secured in the casing unit, thereby reducing stress to be caused in the printed circuit board.

A third example mode is to provide a casing unit for accommodating a printed circuit board on which electronic component parts are mounted, comprising: a case having a plurality of walls, one of the walls being partially or entirely open to form an open surface through which the printed circuit board is inserted into the case and remaining two side walls of the walls each intersecting the open surface; guides secured on the side walls inside the case to provide a path guiding the printed circuit board to be inserted into the case; and a cover, which is applied to the case to cover the open surface of the case, comprising planar-direction positioning members positioning the printed circuit board in a planar direction thereof and being respectively inserted into spaces each formed between each of the side walls of the case and each of sides of the printed circuit board along the path, when the printed circuit board is inserted into the case along the path, whereby the planar-direction positioning members are made to contact both the side walls of the case and the sides of the printed circuit board, and a vertically positioning member positioning the printed circuit board in a vertical direction perpendicular to the planar direction, when the cover is applied to the case to cover the open surface, by pinching an end of the printed circuit board in the vertical direction, the end of the printed circuit board being located in the open surface of the case in which the printed circuit board is positioned in the planar direction by the planar-direction positioning members.

For example, the planar-direction positioning members are protruded from the cover and the vertically positioning member has a recess to pinch an upper and lower surfaces of an end of the printed circuit board existing in the open surface when the printed circuit board is inserted into the case along the path, the recess being open to the case when the cover is applied to the case and having a gap length substantially equal to a thickness of the printed circuit board.

In the case of the above configuration, the cover comprises the planar-direction positioning members and the vertically positioning member, which operate described above. Thus, like the foregoing first and second example modes, a printed circuit board can be positioned in both the planar direction and the vertical direction with no aggressive application of pressure to the board. Stress to be caused in the board can therefore be reduced.

A fourth example mode is to provide a casing unit for accommodating a printed circuit board on which electronic component parts are mounted, comprising: a case having a plurality of walls, one of the walls being partially or entirely open to form an open surface through which the printed circuit board is inserted into the case, remaining two side walls of the walls each intersecting the open surface; guides, which are secured on the side walls inside the case, providing a path guiding the printed circuit board to be inserted into the case and having surfaces to which the printed circuit board to be inserted into the case along the path is touched so that the printed circuit board is poisoned in a vertical direction perpendicular to the printed circuit board; a cover to be applied to the case to cover the open surface of the case; and a coupling protrusion secured on the cover and formed to include an increased diameter portion positionally corresponding to a through-bore formed through the printed circuit board and having a diameter which is not less than a diameter of the through-bore, a distal end portion insertable into the through-bore, and a tapered connecting portion rigidly connecting the increased diameter portion and the distal end portion, whereby, when the cover is applied to the case, the distal end portion is inserted in the through-bore to be fit so that the printed circuit board is positioned in a planar direction of the printed circuit board.

In this configuration, with no aggressive application of pressure to a printed circuit board, the structures of the guides and cover allows the printed circuit board to be positioned well in both the planar and vertical directions. Therefore, in the similar way to the foregoing example modes, stress to be caused in the board can be lessened.

A fifth example mode is to provide a casing unit for accommodating a printed circuit board on which electronic component parts are mounted, comprising: a case having a plurality of walls, one of the walls being partially or entirely open to form an open surface through which the printed circuit board is inserted into the case and remaining two side walls of the walls each intersecting the open surface and having coupling aperture portions formed in the side walls so as to, at least, open toward an inside of the case; guides secured on the side walls inside the case to provide a path guiding the printed circuit board to be inserted into the case; and a cover, which is applied to the case to cover the open surface of the case, comprising a plate covering the open surface of the case, a pair of planar-direction positioning members positioning the printed circuit board in a planar direction thereof, the positioning members being secured to the plate, respectively inserted into spaces each formed between each of the side walls of the case and each of sides of the printed circuit board along the path, when the printed circuit board is inserted into the case along the path, and each formed to have outward positioning protrusions to be fit with the coupling aperture portions of the side walls of the case, whereby the positioning members are made to contact both the side walls of the case and the sides of the printed circuit board, and a vertically positioning member, which is secured to at least one of the plate and the planar-direction positioning members, positioning the case-inserted printed circuit board in a vertical direction perpendicular to the planar direction by pinching an end of the printed circuit board in the vertical direction, the end of the printed circuit board being located in the open surface of the case in which the printed circuit board is positioned in the planar direction by the planar-direction positioning members.

Preferably, the vertically positioning member has a recess to pinch the end of the printed circuit board, the recess being open to the case when the cover is applied to the case and having a gap length substantially equal to a thickness of the printed circuit board.

Like the foregoing, this example mode structure provides the pair of planar-direction positioning members and the vertically positioning member which have the capability of positioning a printed circuit board, as described above. Those positioning members eliminate the necessity for deliberately pressing a printed circuit board and enable the board to be positioned in both the planar and vertical directions, whereby stress in the board can surely be reduced.

With the casing unit described above, the case and the cover may be made of resin material. In such a case, the electronic device can be manufactured to be light in weight. In the meanwhile, the electronic device has less strength than that of a cover and case made of metal. Because of this, the case and cover are liable to be deformed. Even for the case and the cover made of resin material with such less strength, providing the electronic device with the casing structure set forth above enables the electronic device to have increased rigidity and the assembly is made simpler, which is an excellent feature.

The casing unit defined above is suitably applied to an engine ECU (electronic control unit) of a vehicle. There is a need for the engine ECU of the vehicle to have lightweight and, in addition, a need arises for increased rigidity to be provided to address issues arising from increased vibrations delivered from the vehicle. For the engine ECU of the vehicle with such needs, the use of the casing structure set forth above enables the provision of an electronic device with increased rigidity and excellent characteristic in assembling capability.

BRIEF DESCRIPTION OF THE DRAWINGS

In the accompanying drawings:

FIG. 1A is a cross-sectional view of the casing structure as viewed from the above; FIG. 1B is a cross-sectional view taken on line A-A of FIG. 1A; and FIG. 1C is a cross-sectional view taken on line B-B of FIG. 1A;

FIG. 2A is a cross-sectional view of the casing structure as viewed from the above; FIG. 2B is a cross-sectional view taken on line C-C of FIG. 2A; and FIG. 2C is a cross-sectional view taken on line D-D of FIG. 2A;

FIG. 5A is a cross-sectional view of the casing structure as viewed from the above; FIG. 5B is a cross-sectional view taken on line E-E of FIG. 5A; and FIG. 5C is a cross-sectional view taken on line F-F of FIG. 5A;

FIG. 7A is a cross-sectional view of the casing structure as viewed from the above; and FIG. 7B is a cross-sectional view taken on line G-G of FIG. 7A;

FIG. 8A is a cross-sectional view of the casing structure as viewed from the above; and FIG. 8B is a cross-sectional view taken on line H-H of FIG. 8A;

FIG. 9A is a view showing a pre-assembled status of the casing structure; FIG. 9B is a view showing an assembling status of the casing structure; and FIG. 9C is a view showing an aft-assembled status of the casing structure;

FIG. 11A is a cross-sectional view of the casing structure as viewed from the above; FIG. 11C is a cross-sectional view taken on line K-K of FIG. 11A;

FIG. 12A is a view showing a pre-assembled status of the casing structure; FIG. 12B is a view showing an assembling status of the casing structure; and FIG. 12C is a view showing an aft-assembled status of the casing structure.

DETAILED DESCRIPTION OF PREFERRED EMBODIMENTS

Various embodiments of casing structures according to the present invention will be described below in detail with reference to the accompanying drawings.

First Embodiment

Referring to FIGS. 1A to 1C-2A to 2C, a casing unit for a casing unit for an electronic device will now be described. The electronic device, shown in conjunction with the present embodiment, is employed as an engine ECU (Electronic Control Unit) of a vehicle.

Figure 1A:
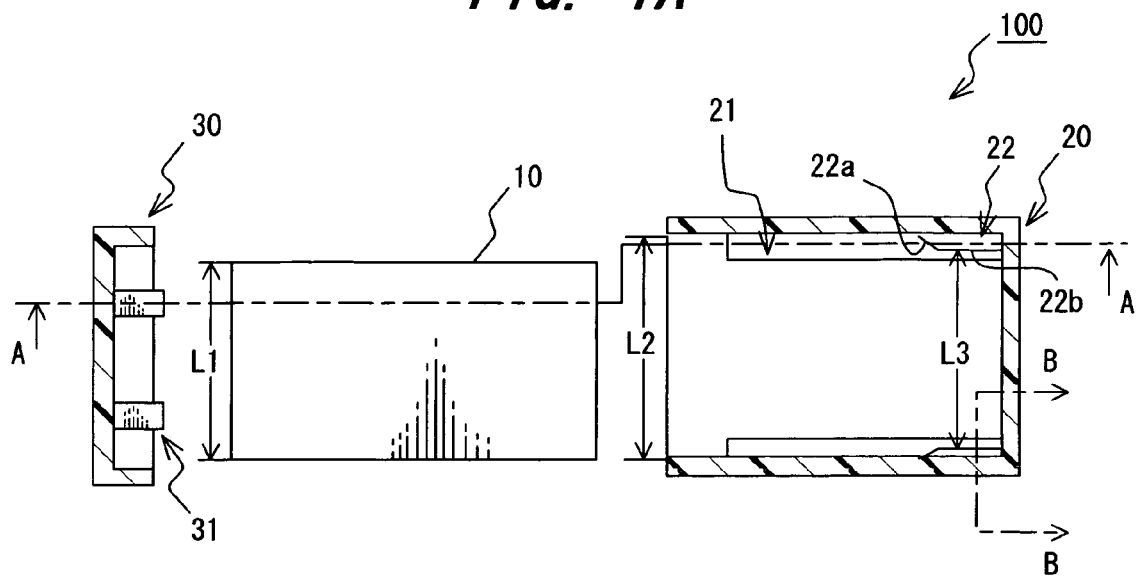
FIGS. 1A to 1C are views showing pre-assembled statuses for illustrating a casing structure of an electronic device of a first embodiment.
Figure 1B:
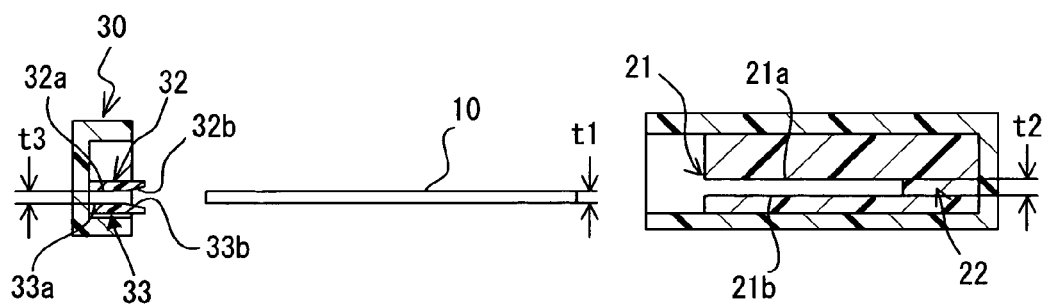
Figure 1C:
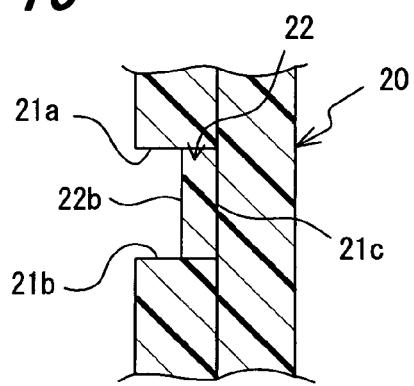

As shown in FIGS. 1A to 1C, the electronic device 100 with a casing unit according to the present embodiment is comprised of a printed circuit board 10, on which electronic component parts (not shown) are mounted, a case 20, in which the printed circuit board 10 is accommodated, and a cover 30 by which the case 20 is covered. The present embodiment has a characteristic feature in that the printed circuit board 20 is supported within the casing unit, composed of the case 20 and the cover 30, and the following description will be given with a focus on the case 20 and/or the cover 30.

The case 20 is formed of resin material (such as propylene) in a box-like configuration with one open end. Both side faces of the case 20 have guides 21 that allow the printed circuit board 10 to be inserted from the open end to a rearward area of the case 20.

The guides 21 are disposed on both sides of the case 20 in concave shapes, respectively, such that a distance t2 between a guide upper surface 21a and a guide lower surface 21b is greater than a thickness t1 of the printed circuit board 10 to allow the printed circuit board 10 to easily slide to the rearward area of the case 20 while a distance L2 between opposing side surfaces 21c (the side faces of the case 20) of the guides 21 is greater than a width L1 of the printed circuit board 10. Also, the guides 21 have guide protruding members 22 that protrude from the side faces 21c (the side faces of the case 20) of the respective guides 21 into a path, to which the printed circuit board 10 is introduced toward the rearward area of the case 20, and are brought into contact with the sides of the printed circuit board 10 which in turn is positioned in a planar direction.

Each guide protruding member 22 includes a first slope 22a, which is inclined from an area closer to the open end of the case 20 to the rearward area thereof in a way to gradually decrease a distance with respect to the opposing side face of the printed circuit board 10 that is inserted, and a first retainer 22b contiguous with the first slope 22a through which the side surface 21c of the guide 21 and the first retainer 22b is connected. It is sufficed for the first guide protruding member 22 to be located on at least the both sides of the case 20 with no particular limitation intended on the number of first guide protruding members 22. The number of first guide protruding members 22 to be provided may differ depending on a length and thickness of the printed circuit board 10. With the present embodiment, the first guide protruding members 22 are provided in a pair and located in mutually opposing positions at the rearward area of the case 20.

Further, a length, in which the first retainers 22b are held in contact with the sides of the printed circuit board 10, is not particularly limited. However, if the length of the first retainers 22b is too long, the printed circuit board 10 is hardly inserted into the case 20. To address such inconvenience, the first retainers 22b are formed in a given length to be brought into contact with the sides of the printed circuit board 10 such that the printed circuit board 10 is easily inserted to the case 20 while enabling the printed circuit board 10 to be fixedly retained in the planar direction. Moreover, a distance L3 between the first retainers 22b formed on both sides of the case 20 is set to be substantially equal to the width L1 of the printed circuit board 20. Also, with the present embodiment, the guides 21 and the first guide protruding members 22 are formed of the same material as that of the case 20 in an integral fashion.

The cover 30 is formed of the same material (such as polypropylene) as that of the case 20 and has vertically positioning members 31 by which the printed circuit board 10 is positioned in a vertical direction thereto (i.e., a direction perpendicular to the board) when the cover 30 is assembled to the case 20.

Each of the vertically positioning members 31 is configured in a structure to pinch a distal end, closer to the open side of the case 20, of the printed circuit board 10 on both sides thereof with a width substantially equal to the thickness t1 of the printed circuit board 10, under a situation where the printed circuit board 10 is inserted to the case 20, to cause the printed circuit board 10 to be positioned in terms of a vertical direction thereof. Accordingly, each vertically positioning member 31 may include at least one area formed with upper and lower portions, with which the upper and lower surfaces of the printed circuit board 10 is brought into contact, with a thickness t3 between the upper and lower portions being sufficed to be substantially equal to the thickness t1 of the printed circuit board 10 while no particular limitation is intended in shape and position of these component elements to be provided. With the present embodiment, the vertically positioning member 31 is comprised of a vertically positioning upper segment 32, protruding from an inner wall of the cover 30 to be held in contact with the upper surface of the printed circuit board 10, a vertically positioning lower segment 33, to be held in contact with the lower surface of the printed circuit board 10, and the inner wall of the cover 30.

The vertically positioning upper segment 32 and the vertically positioning lower segment 33 include pinch portions 32a, 33a, respectively, that substantially and vertically extend from the inner wall of the cover 30 to have symmetric configurations between which the printed circuit board 10 is sandwiched, and tapered portions 32b, 33b contiguous with the pinch portions 32a, 33a, respectively, and tapered in directions to progressively increase a width toward distal ends of the tapered portions 32b, 33b. Moreover, the pinch portions 32a, 33a are spaced from each other by the distance t3, substantially equal to the thickness t1 of the printed circuit board 10, and the pinch portion 33a of the vertically positioning lower segment 33 has a surface aligned on the same height (on the same plane) with the lower surface 21b of the guide 21 under a situation where the cover 30 is assembled to the case 20.

In addition, the vertically positioning members 31, each comprised of the vertically positioning upper segment 32 and the vertically positioning lower segment 33, are provided in a pair at positions symmetric with respect to a central position of a short side of the printed circuit board 10 formed in a rectangular shape.

Figure 2A:
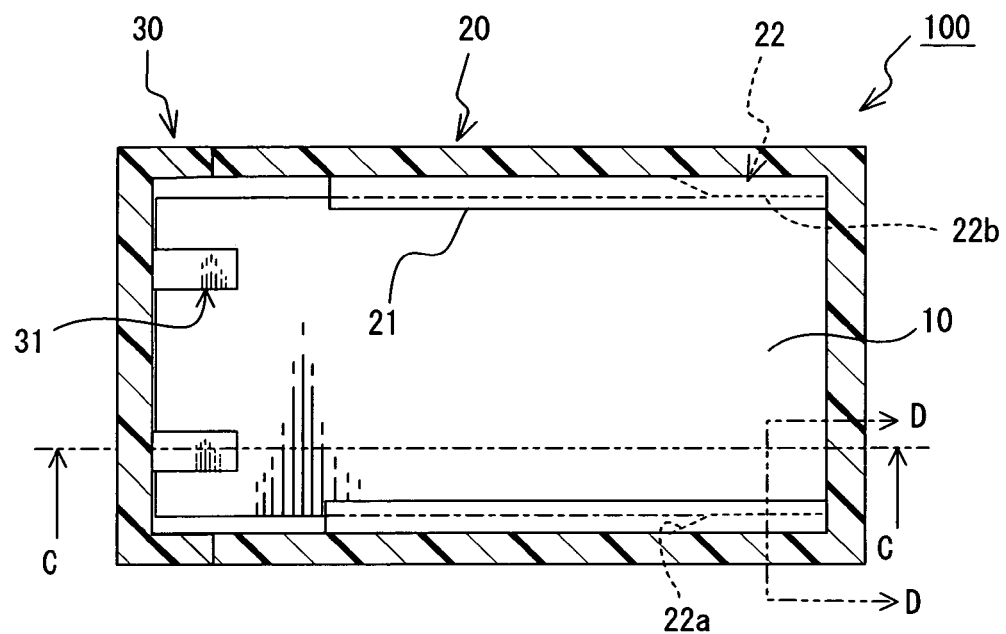
FIGS. 2A to 2C are views showing aft-assembled statuses for illustrating the casing structure of the electronic device.
Figure 2B:
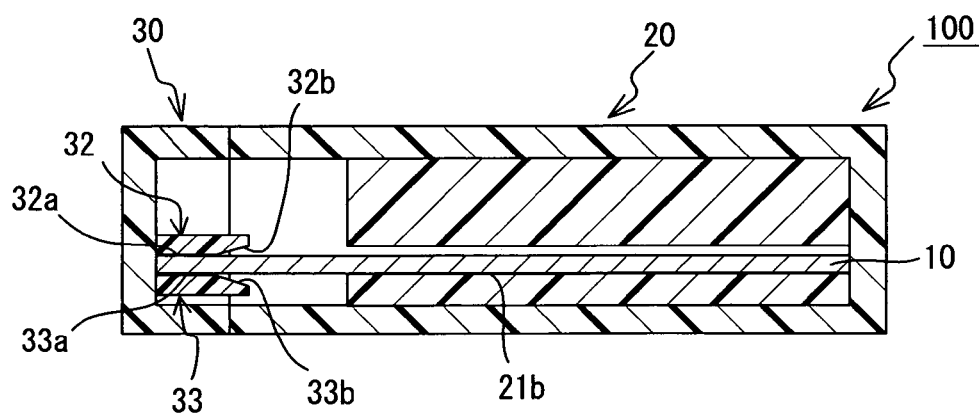
Figure 2C:
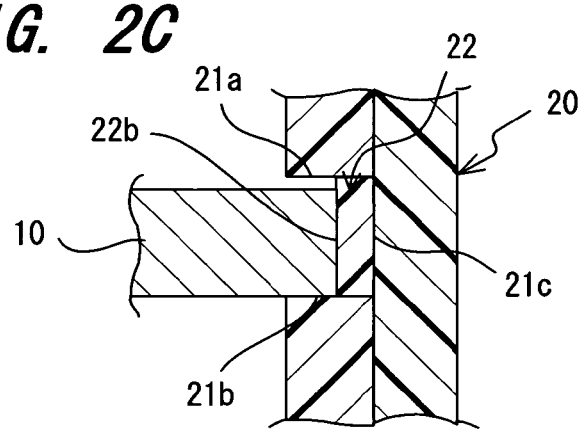

The electronic device 100, with such a structure set forth above, is assembled in a sequential manner described below. First, the printed circuit board 10 is inserted to the case 20 along the guides 21. When this takes place, the printed circuit board 10 is guided by the first slopes 22a, formed on the guides 21, respectively, to be positioned in a given position in terms of the planar direction and then introduced to the rearward area of the case 20, upon which the printed circuit board 10 is retained with the first retainers 22, located on the both sides of the case 20, and fixedly positioned in terms of the planar direction as shown in FIGS. 2A to 2C. With the present embodiment, a leading end of the printed circuit board 10 is held in contact with a rear wall (on a surface opposite to the open end) of the case 20 to further restrict behavior of the printed circuit board 10 in the planar direction.

The cover 30 is assembled to the case 20 through the use of, for instance, appropriate engagement means (such as by claw-clamping and screw-tightening, etc.) that is not shown. During such assembling, a trailing edge, closer to the open end of the case 20, of the printed circuit board 10 is inserted to a space between the tapered portions 32b, 33b of the vertically positioning upper segment 32 and the vertically positioning lower segment 33, forming the vertically positioning members 31 provided on the cover 30, such that the printed circuit board 10 is positioned by the tapered portions 32b, 33b with the cover 30 being assembled. Then, the trailing edge of the printed circuit board 10 is inserted to a space between the pinch portions 32a, 33a. Consequently, under a circumstance where the cover 30 is assembled to the case 20, the printed circuit board 10 is pinched by the pinch portions 32a, 33a and fixedly positioned in the planar direction.

Thus, with the casing structure of the electronic device 100, shown in the present embodiment, the printed circuit board 10 is guided in a given position by the first guide protruding members 22, provided on the case 20, and the vertically positioning members 31 formed on the cover 30 and retained in the given position with the same width and thickness as those of the printed circuit board 10. Therefore, the printed circuit board 10 can be fixedly secured without positively pressing the printed circuit board as needed in the related art, enabling reduction in stress applied to the printed circuit board 10 during the positioning and fixing thereof. That is, the printed circuit board 10 is available to effectively mount electronic component parts, enabling improvement in board density of the printed circuit board 10 and/or minimizing a size of the printed circuit board 10 (a physical size of the electronic device 100). Thus, the casing structure illustrated in the present embodiment is suited for supporting the printed circuit board 10 with less clearance and play in a widthwise and thickness direction thereof.

In the present embodiment, the surface of the pinch portion 33a of the vertically positioning lower segment 33 is set to be aligned on the same height (on the same plane) as that of the lower surface 21b of the guide 21 under a situation where the cover 30 is assembled to the case 20. Accordingly, the printed circuit board 10 takes a flat situation under a condition where the printed circuit board 10 is positioned for fixing in the planar and vertical directions, enabling reduction in stress that would occur on the printed circuit board 10 during the positioning and fixing thereof.

In the present embodiment, the first guide protruding members 22 are provided on the both sides of the case 20 in opposing positions. Accordingly, this allows the printed circuit board 10 to be easily inserted to the rearward area of the case 20 and enables the printed circuit board 10 to be firmly fixed in the planar direction. In addition, since the first guide protruding members 22 are formed in the case 20 at a rearward area thereof, it becomes easy for the printed circuit board 10 to be inserted due to a reduction in time to be contact between the printed circuit board 10 and the first guide protruding members 22 (on the first retainers 22b) during work for inserting the printed circuit board 10 to the case 20.

Further, due to the presence of an increase in distance between the trailing end of the printed circuit board 10, to be fixedly secured by the vertically positioning members 31, and the first guide protruding members 22, the printed circuit board 10 can be firmly fixed in a position with the first guide protruding members 22 and the vertically positioning members 31.

Figure 3:
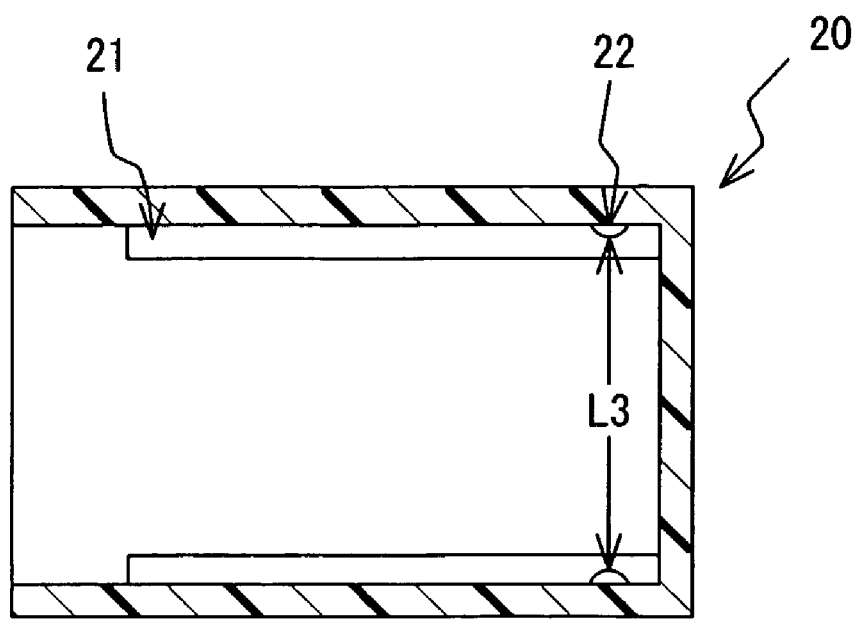
FIG. 3 is a cross-sectional view showing a modified form of the structure according to the first embodiment.

The present embodiment has also been shown with reference to an example wherein the first retainers 22b are held in surface contact with the printed circuit board 10 to fixedly retain the same. However, for instance, as shown in FIG. 3, an alternative may also be configured such that the first guide protruding members 22 are formed in semi-spherical shapes, respectively, and held in point contact with the printed circuit board 10 on the sides thereof. However, with such a structure wherein the first retainers 22b held in surface contact with the sides of the printed circuit board 10 in given lengths, the printed circuit board 10 can be fixedly secured in a further firm fashion.

Figure 4:
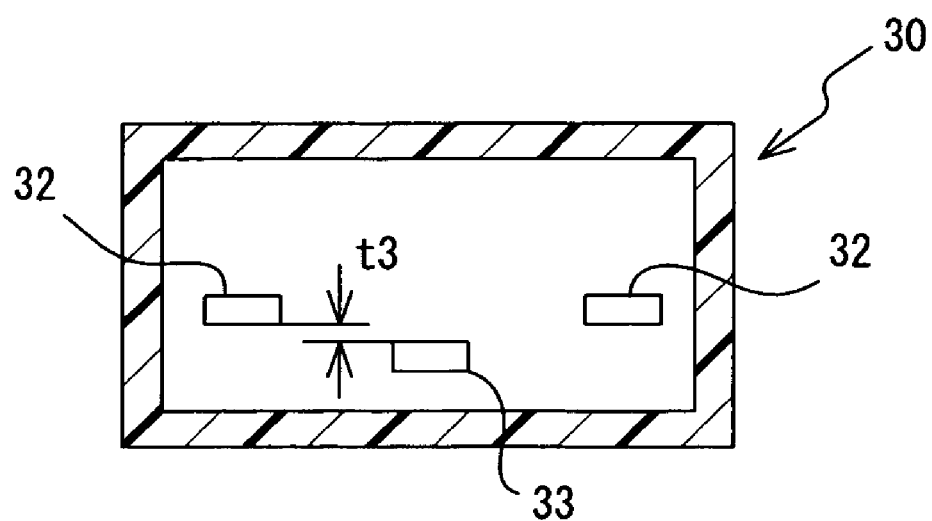
FIG. 4 is a cross-sectional view showing another modified form of the first embodiment.

The present embodiment has also been shown in conjunction with an example wherein the vertically positioning upper segment 32 and the vertically positioning lower segment 33, forming each of the vertically positioning members 31, are located in overlapped positions in the planar direction of the printed circuit board 10. However, another alternative may take a structure such that the vertically positioning upper segment 32 and the vertically positioning lower segment 33 are located in different positions in the planar direction of the printed circuit board 10. For instance, as shown in FIG. 4, the vertically positioning member 31 may also take a structure including a pair of the vertically positioning lower segment 33, provided in a position to be brought into contact with a substantially central area of the trailing end, closer to the open end of the case 20, of the printed circuit board 10 at the lower surface of the printed circuit board 10 and the vertically positioning upper segment 32, to be held in contact with the upper surface of the printed circuit board 10, provided in a symmetric position so as to sandwich the printed circuit board 10 with the vertically positioning lower segment 33.

The present embodiment has also been shown with reference to an example wherein each of the vertically positioning members 31 is comprised of the vertically positioning upper segment 32 and the vertically positioning lower segment 33, extending from the caver 30, and the inner wall of the cover 30. However, the vertically positioning member 31 may take an alternative structure. For instance, the alternative structure may include a recessed configuration formed on a flat portion (bottom wall) of the cover 30 that closes the open area of the case 20.

As set forth above, in contrast to a concept of the related art wherein the printed circuit board 10 is fixedly secured upon pressing thereof, the present embodiment is based on a concept with a view to eliminating the oscillation of the printed circuit board 10. In contrast to the related art technology wherein the printed circuit board 10 is applied with stress in the order of 600 micro strange (με), the present embodiment makes it possible to allow stress, applied to the printed circuit board 10, to be less than the order of 200 με. More particularly, stress to be applied to the printed circuit board 10 can be limited to a value less than 100 με and, more preferably, to a value less than 50 με. That is, the present embodiment is configured to support the printed circuit board 10 in contact with the first retainers 22b and the vertically positioning members 31.

Second Embodiment

Figure 5A:
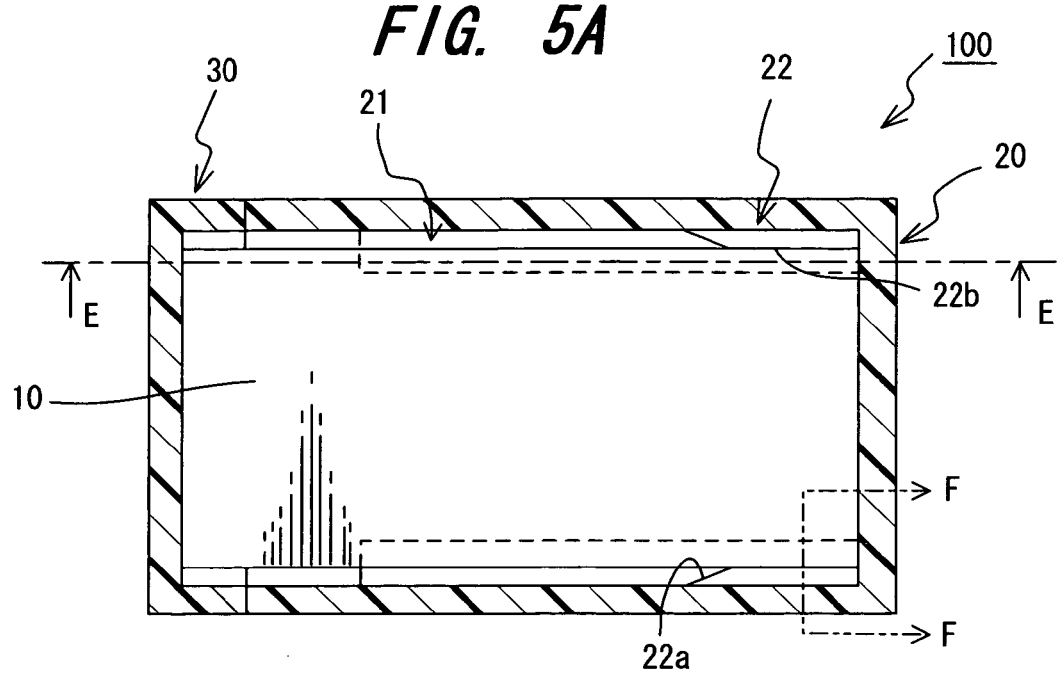
FIGS. 5A to 5C are views showing aft-assembled statuses for illustrating a casing structure of an electronic device of a second embodiment.
Figure 5B:
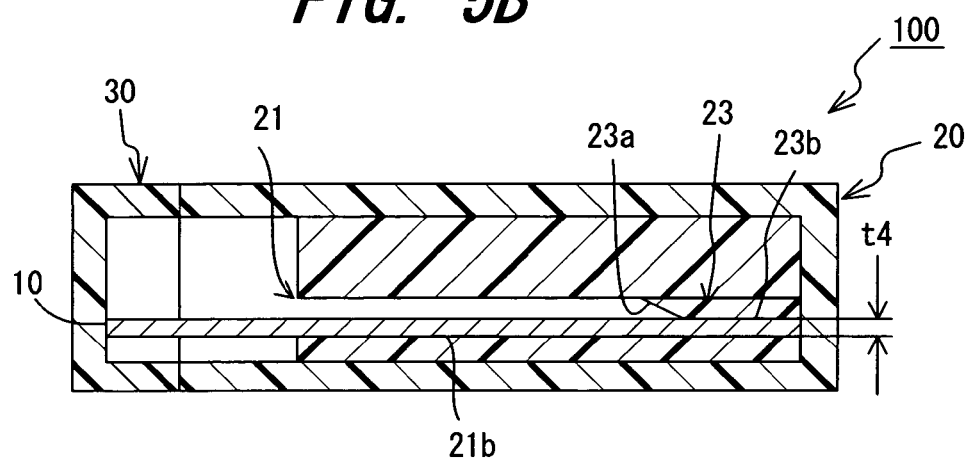
Figure 5C:
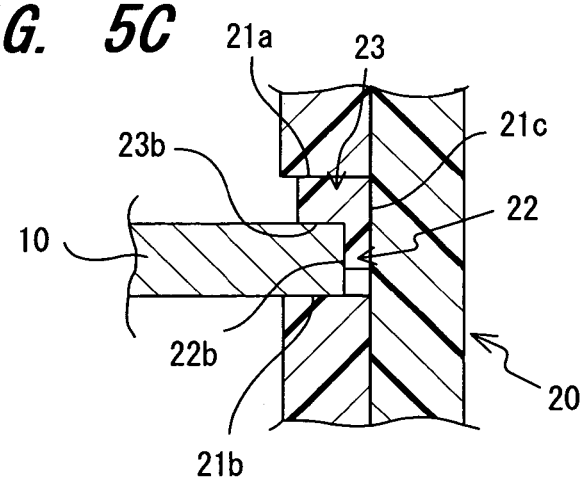

A second embodiment according to the present invention will now be described with reference to FIGS. 5A to 5C, in which the upper surface (21a) of the guide 21 is omitted in FIG. 5A.

The casing structure of the electronic device 100 of the second embodiment is mostly common in structure to the first embodiment and, so, a detailed description of common component parts is omitted with description made with a focus on differing points.

The second embodiment differs from the first embodiment in that second guide protruding members are provided on the case 20 with a view to positioning and fixing the printed circuit board 10 in a vertical direction thereof.

The electronic device 100 of the present embodiment includes the first guide protruding members 22 provided on the respective guides 21 of the case 20 as the component elements for permitting the printed circuit board 10 to be positioned and fixed in the planar direction thereof like the first embodiment. Also, the electronic device 100 further includes a second guide protruding members 23, provided on the respective guides 21 of the case 20, which serve as members for allowing the printed circuit board 10 to be positioned and fixed in a vertical direction as shown in FIGS. 5A to 5C.

Each of the second guide protruding members 23 is configured so as to protrude from at least one of the upper surface 21a and the lower surface 21b of the associated guide 21 to be brought into contact with at least one of the upper surface and the lower surface of the printed circuit board 10 to cause the same to be positioned and fixed in the vertical direction thereof. In the present embodiment, each of the second guide protruding members 23 is comprised of a second slope 23a, made of the same material as that of the case 20 in a unitary fashion and protruding from the upper surface 21a of the associated guide 21 so as to slope inward from the open side of the case 20 in a direction (to decrease a distance relative to the upper surface of the printed circuit board 10 in the present embodiment) to gradually decrease a distance relative to the upper surface or the lower surface of the printed circuit board 10 that is inserted, and a second retainer 23b contiguous with the second slope 23a. That is, the presence of the second slope 23a allows the upper surface 21a of the guide 21 and the second retainer 23b to be connected.

No limitation is intended to the number of such component elements. That is, the number of component elements may be modified depending on a length and thickness of the printed circuit board 10. With the present embodiment, each of the second guide protruding members 23 is comprised of a pair of guide protruding members that are located in the case 20 at the rearward area thereof in a mutually facing relationship.

Additionally, no particular limitation is intended to a length of the second retainer 23b in contact with the upper surface (lower surface) of the printed circuit board 10. However, if such a length is too large, the printed circuit board 10 is hard to be inserted to the case 20. Therefore, the present embodiment is configured in structure to allow the first retainer 23b to be brought into surface contact with the upper surface of the printed circuit board 10 over a given range such that the printed circuit board 10 can be easily inserted to the case 20 and firmly fixed in the vertical direction. Furthermore, with the guide 21, a distance t4 between the second retainer 23b and the lower surface 21b of the guide 21 is set to be substantially equal to the thickness t1 of the printed circuit board 10.

In the present embodiment, the guides 21, the first guide protruding members 22 and the second guide protruding members 23 are made of the same material as that of the case 20 to be integral therewith.

Accordingly, when inserting the upper surface of the printed circuit board 10 into the case 20 along the guides 21, the printed circuit board 10 is positioned in a given position in the planar direction by the first slopes 22a formed on the respective guides 21 and guided to the rearward area of the case 20, while the printed circuit board 10 is retained with the first retainers 22b provided on both sides of the case 20 to be positioned and fixed in the planar direction.

At the same time, the printed circuit board 10 is positioned in a given position in the vertical direction by the second slopes 23a formed on the respective guides 21 and guided to the rearward area of the case 20, while the printed circuit board 10 is retained with the second retainers 23b provided on both sides of the case 20 to be positioned and fixed in the vertical direction. Additionally, with the present embodiment, the leading end of the printed circuit board 10 is held in contact with the rear surface (back surface) of the case 20 and behavior of the printed circuit board 10 is further restricted in terms of the planar direction.

The cover 30 is then assembled to the case 20 by means of, for instance, some suitable engagement means (such as by claw-clamping or screw-tightening etc.), not shown, so as to close the open end of the case 20, thereby forming the electronic device 100.

Thus, with the casing structure of the electronic device 100 shown in the present embodiment, the printed circuit board 10 is guided in a given position with the first guide protruding members 22 and the second guide protruding members 23 provided in the case 20 to allow the printed circuit board 10 to be retained in such a given position with substantially the same width and thickness of the printed circuit board 10. Accordingly, the printed circuit board 10 can be fixed with no need for an external force to be positively applied as required in the related art, enabling reduction in stress to be applied to the printed circuit board 10 during positioning and fixing work thereof.

Therefore, electronic component parts can be mounted on the printed circuit board 10 in an effective fashion, enabling improvement over mounting density of the printed circuit board 10 and/or minimization of the printed circuit board 10 (in physical size of the electronic device 100). Stated another way, the printed circuit board 10 can be supported and fixed in place with no application of overstress for the support like the first embodiment.

With the present embodiment, the second guide protruding members 23 are located in the case 20 on both sides thereof in face-to-face relationship. Consequently, the printed circuit board 10 can be easily inserted to the rearward area of the case 20, enabling the printed circuit board 10 to be firmly fixed in the vertical direction.

In addition, the second guide protruding members 23 are provided in the rear area of the case 20, reducing a time interval in contact between the printed circuit board 10 and the second guide protruding members 23 to provide the ease of insertion.

The present embodiment has been shown in conjunction with an example wherein the second guide protruding members 23 are brought into surface contact with the upper surface of the printed circuit board 10 that in turn is retained. In an alternative, the second guide protruding members 23 may take structures to be brought into point contact with the upper surface of the printed circuit board 10. However, if the second guide protruding members 23 take the structures to be brought into surface contact with at least one of the upper and lower surfaces of the printed circuit board 10 over given ranges, the printed circuit board 10 can be further firmly fixed in the vertical direction.

The present embodiment has also been shown in conjunction with an example wherein the second guide protruding members 23 protrude from the upper surfaces 21a of the respective guides 21. However, each of the second guide protruding members 23 may be sufficed to take a structure so as to protrude from at least one of the upper surface 21a and the lower surface 21b of the guide 21. Thus, the second guide protruding members 23 may take structures that protrude from both surfaces 21a, 21b or other structures that protrude from different surfaces (at one position from the upper surface 21a and the other position from the lower surface 21b) on both sides of the printed circuit board 10.

Besides, the present embodiment has been shown in conjunction with an example wherein the second guide protruding members 23 are integrally formed with the first guides 21. However, it is needless to say that these component elements may be separately formed.

Third Embodiment

Figure 6:
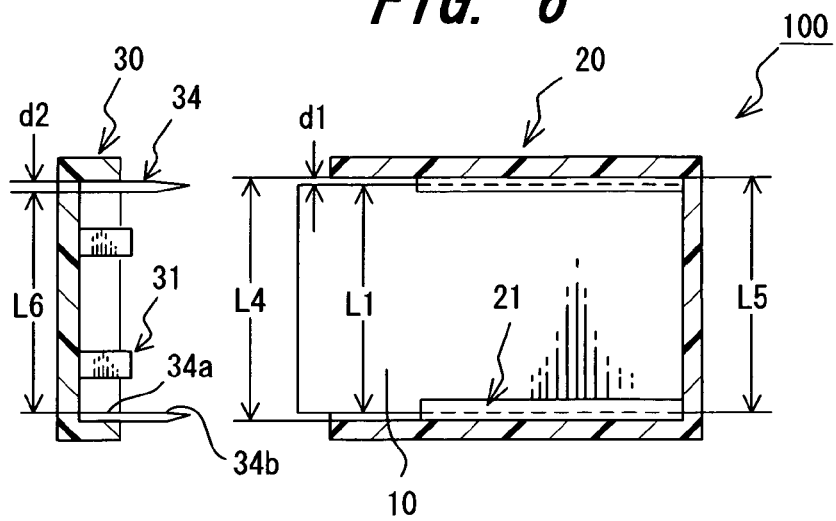
FIG. 6 is a view showing a status, wherein a printed circuit board is inserted to a case, for illustrating a casing structure of an electronic device of a third embodiment.
Figure 7A:
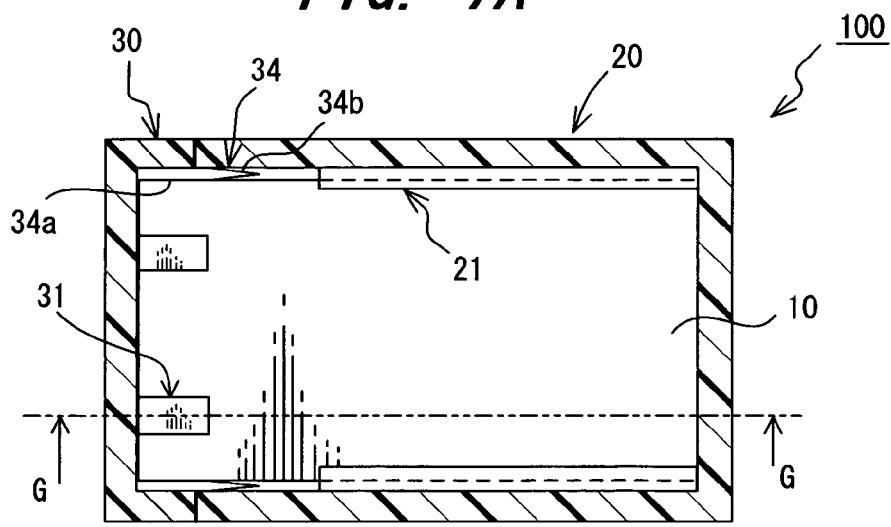
FIGS. 7A and 7B are views showing aft-assembled statuses for illustrating the casing structure of the electronic device of the third embodiment.
Figure 7B:
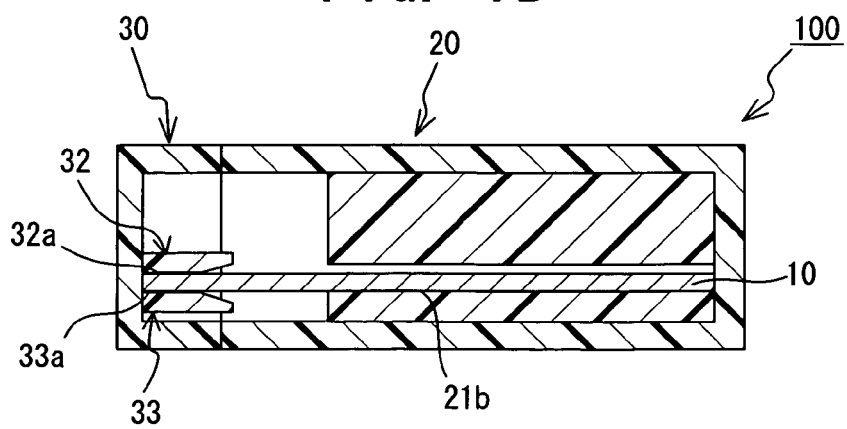

A third embodiment according to the present invention will now be described with reference to FIG. 6 and FIGS. 7A and 7B.

The casing structure of the electronic device 100 of the third embodiment is mostly common to that of the first embodiment and, so, description of the common component parts are herein omitted while description is made with a focus on differing component parts.

The third embodiment differs from the first embodiment in that a gap adjuster is provided on the cover 30 to position and fix the printed circuit board 10 in terms of the planar direction thereof.

In normal practice, the box-like case 20 is formed by injection molding or aluminum die-casting upon flowing component material under melted condition into a die-mold formed in a given configuration. When this takes place, in order to provide an increased stripping capability of the mold for the case 20 to be stripped off and provide improved durability of the mold, it has been a general practice for the mold to have a profile shaped such that the side faces of the case 20 are not perpendicular to a bottom wall of the case 20 but is slightly inclined to widen the open end of the case 20 (such that an open end width L4 is larger than a rear end width L5 of the case 20 as shown in FIG. 6).

Consequently, when inserting the printed circuit board 10 with a rectangular shape into the case 20 formed in such a configuration, there is a gap d1 between an inner side face of the case 20 at the open end thereof and the adjacent side surface of the printed circuit board 10. The present embodiment contemplates to utilize this gap d1 to allow the printed circuit board 10 to be positioned and fixed in place.

Like the first embodiment, the cover 30 of the third embodiment has the vertically positioning members 31 by which under a status wherein the cover 30 is assembled to the case 20, the trailing end of the printed circuit board 10 is pinched at the both surfaces thereof with a width t3 substantially equal to the thickness t1 of the printed circuit board 10 to allow the printed circuit board 10 to be positioned in the vertical direction.

In addition, the cover 30 further includes gap adjusters 34, protruding from the cover 30, which under a status wherein the printed circuit board 10 is inserted to the case 20, remain in the respective gaps d1 formed between the internal surfaces of the case 20 and the associated side surfaces of the printed circuit board 10. On the other hand, when the cover 30 is assembled to the case 20, the gap adjusters 34 are held in contact with both side surfaces of the case 20 and both side surfaces of the printed circuit board 10 to position the printed circuit board 10 in the planar direction.

The gap adjusters 34 are made of the same material as that of the cover 30 to be integral therewith and located for the respective gaps created between the internal side surfaces of the case 20 and the both side surfaces of the printed circuit board 10. Each of the gap adjusters 34 is comprised of a base portion 34a with a width d2 substantially equal to the gap d1 and a tapered portion 34b contiguous with the base portion 34a and having a thickness progressively decreasing toward a distal end.

Moreover, a distance L6 between the base portions 34a of the pair of gap adjusters 34 to be held in contact with the both sides of the printed circuit board 10 is set to be nearly equal to the width L1 of the printed circuit board 10. Accordingly, when assembling the cover 30 to the case 20, the gap adjusters 34, protruding from the cover 30, are inserted to the associated gaps between the internal side faces of the case 20 and the side surfaces of the printed circuit board 10 from the tapered portions 34b. Hence, under a status where the cover 30 is assembled to the case 20, the gap adjusters 34 are brought into contact with both the side surfaces of the case 20 and the side surfaces of the printed circuit board 10 to cause the printed circuit board 10 to be retained between the base portions 34a. This allows the printed circuit board 10 to be positioned and fixed in the planar direction. Also, the printed circuit board 10 is pinched by the vertically positioning members 31 to cause the same to be positioned and fixed in the vertical direction.

Consequently, the printed circuit board 10 can be positioned and fixed in place without a need for external forces to be positively applied as required in the related art. That is, even with the casing structure of the present embodiment, it becomes possible to achieve reduction in stress that would be caused in the printed circuit board 10 due to fixing work. Stated another way, the printed circuit board 10 can be supported and fixed in place with no application of overstress for the support as in the first embodiment.

In the foregoing description, the present embodiment has also been shown with reference to an example wherein the base portions 34a of the gap adjusters 34 are held in contact with both the side surfaces of the case 20 and the side surfaces of the printed circuit board 10 to cause the same to be positioned and fixed in place in the planar direction. However, an alternative may be such that the printed circuit board 10 is positioned and fixed in place at the tapered portions 34b.

Further, the present embodiment has been shown with reference to an example wherein the gap adjusters 34 are provided on the cover 30 for the respective gaps created between the both side surfaces of the case 20 and the both side surfaces of the printed circuit board 10. However, an alternative may be possible such that one of the gap adjusters 34 is inserted to one of the gaps to allow the printed circuit board 10 to be positioned and fixed between the gap adjuster 34 and the internal side surface (at a side surface 21c of the guide 21) of the case 20.

Fourth Embodiment

A fourth embodiment according to the present invention will now be described in detail with reference to FIGS. 8A and 8B and FIGS. 9A to 9C.

The casing structure of the electronic device 100 of the fourth embodiment is mostly common to the first embodiment and, so, detailed description of the component parts is omitted with description being given with a focus on different component parts.

The fourth embodiment differs from the first embodiment in that the cover 30 is provided with mating projections adapted to mate with through-bores of the printed circuit board 10 to cause the same to be positioned and fixed in place in terms of the planar and vertical directions.

Figure 8A:
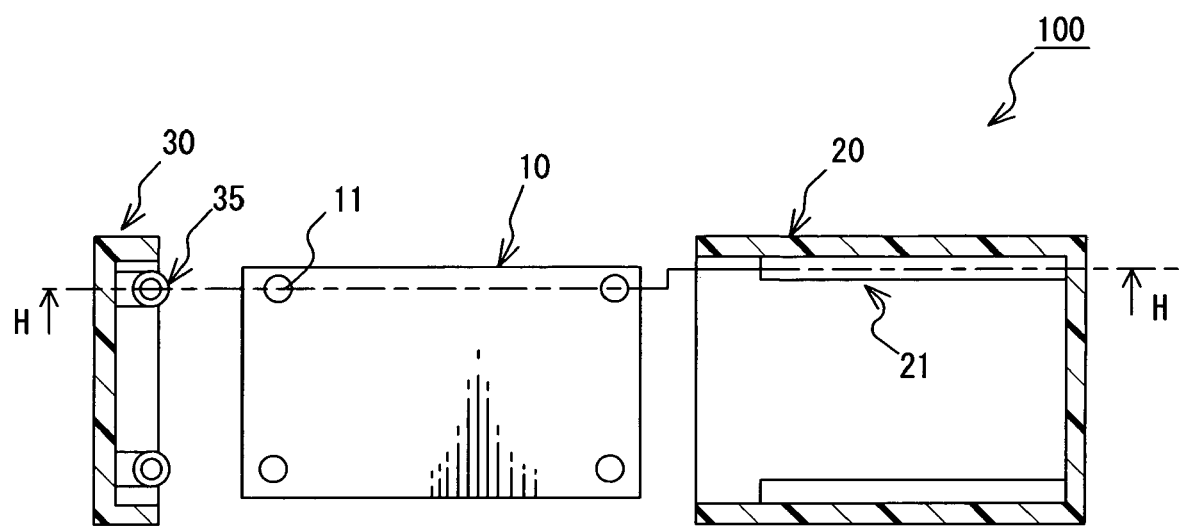
FIGS. 8A and 8B are views showing pre-assembled statuses for illustrating a casing structure of an electronic device of a fourth embodiment.
Figure 8B:
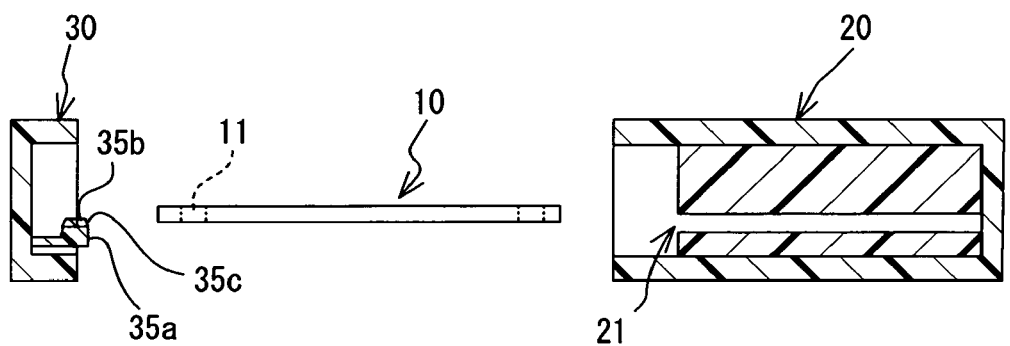

In normal practice, for the purpose of transferring and/or positioning the printed circuit board 10 on a production process of the electronic device 100, the printed circuit board 10 has non-circuitry regions formed with the through-bores 11, respectively, as shown in FIGS. 8A and 8B. The present embodiment contemplates to allow the printed circuit board 10 to be positioned and fixed in place by utilizing these through-bores 11.

As shown in FIGS. 8A and 8B, the cover 30 of the present embodiment has coupling protrusions 35 that protrude from a flat portion, by which the open end of the case 20 is closed, and have distal ends formed in substantially L-shaped configurations, respectively, which are bent toward the printed circuit board 10 in compliance with the through-bores 11 of the printed circuit board 10.

More particularly, each coupling protrusion 35 is made of the same material as that of the cover 30 to be integral therewith and includes an increased diameter portion 35a, provided in correspondence with each through-bore 11 of the printed circuit board 10, a distal end portion 35b, adapted to be fitted into the associated through-bore 11, and a tapered connecting portion 35c through which the distal end portion 35b and the increased diameter portion 35a are connected.

Figure 9A:
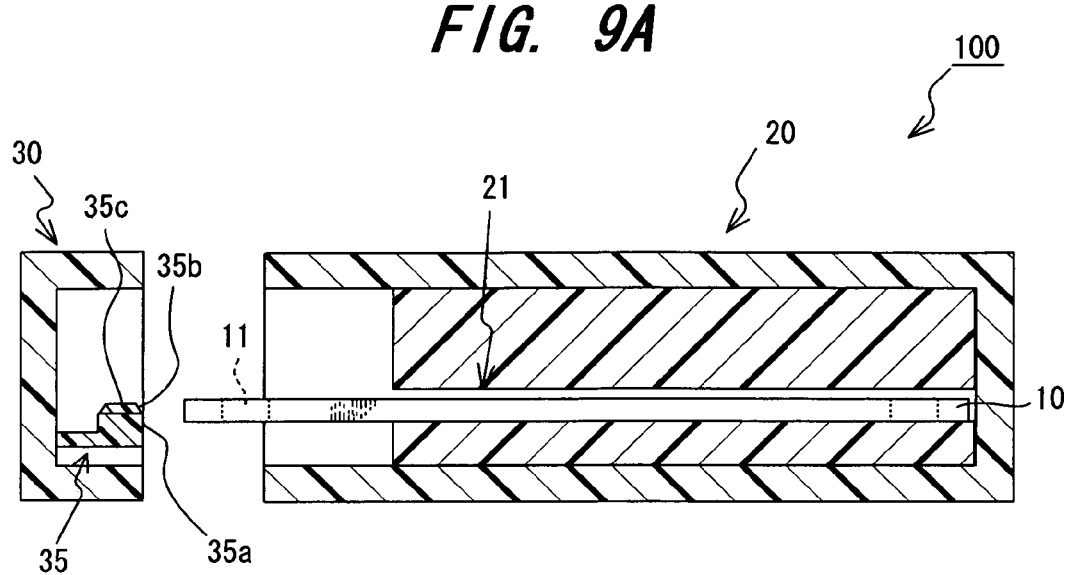
FIGS. 9A to 9C are views for illustrating the casing structure of the electronic device of the fourth embodiment.
Figure 9B:
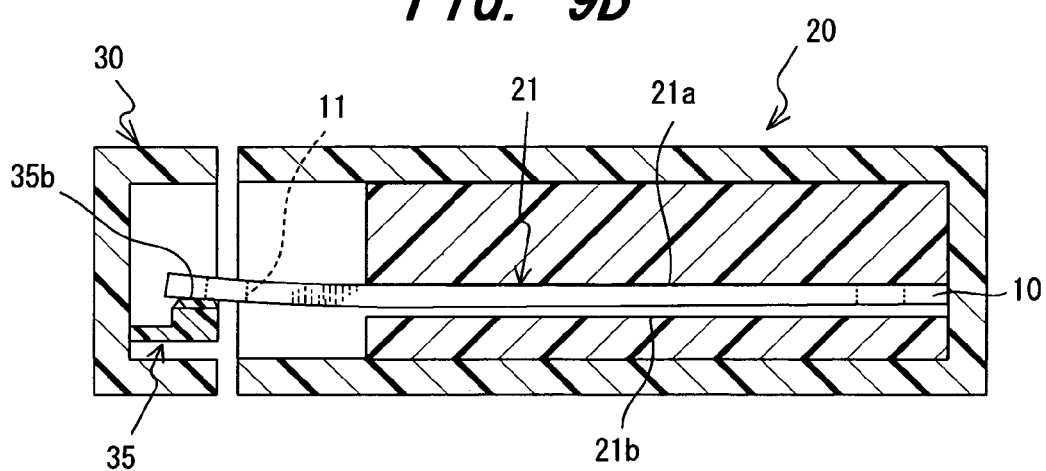
Figure 9C:
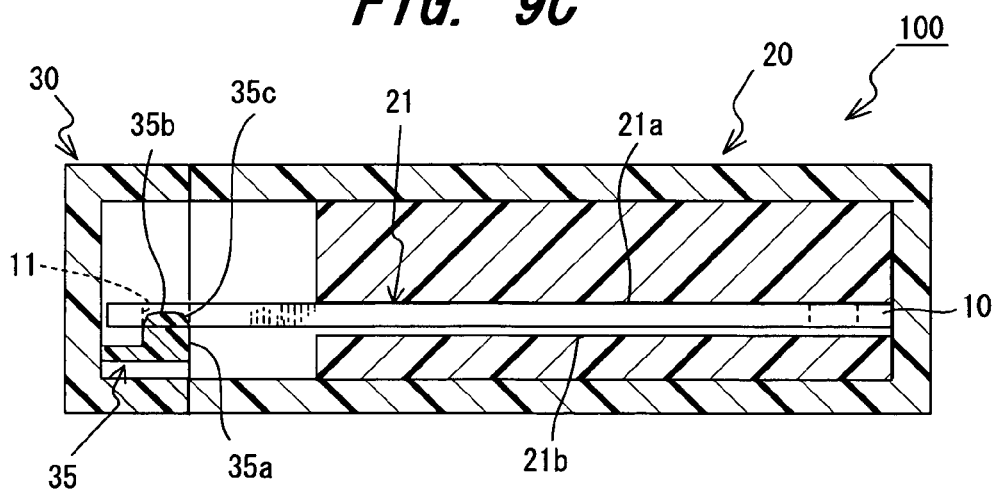

The cover 30, formed with the coupling protrusions 35, is assembled to the case 20, in which the printed circuit board 10 is accommodated, in a sequence shown in FIGS. 9A to 9C. The distal ends 35a of the coupling protrusions 35 are located at positions with respect to the inner bottom wall of the case 20 to be higher than the lower surface of the printed circuit board 10 but lower than the upper surface thereof, under a condition where the printed circuit board 10 is held in contact with the upper surface 21a of the guide 21, whereby a boundary area between the base portion 35a and the connecting portion 35c assumes a position below the lower surface of the printed circuit board 10.

Accordingly, if an attempt is made to allow the cover 30 to approach the open end of the case 20, as shown in FIG. 9B, under a status wherein the distal ends 35b of the coupling protrusions 35 are held in contact with the lower surface of the printed circuit board 10, the printed circuit board 10, supported at its lower surface with the coupling protrusions 35, is brought into contact with the upper surface 21a of the guide 21 and, in addition, resiliently deformed to cause the trailing end, closer to the open end of the case 20, of the printed circuit board 10 to be higher than the upper surface 21a of the guide 21. Under such a state, the cover 30 is brought into contact with the open end of the case 20 to carry out the assembling.

When this takes place, the bent areas of the coupling protrusions 35 assume the positions immediately beneath the associated through-bores 35b, respectively, and due to a reaction force of the resiliently deformed printed circuit board 10, the distal ends 35b are inserted into the associated through-bores 11 as shown in FIG. 9C. Then, either the connecting portions 35c or the increased diameter portions 35a are caused to engage internal walls of the associated through-bores 11, thereby causing the printed circuit board 10 to be positioned and fixed in place.

Moreover, under such a positioned status, the printed circuit board 10 is pressed against the upper surface 21a of the guide 21 while the printed circuit board 10 is supported at its lower surface with the coupling protrusions 35, resulting in an ability for the printed circuit board 10 to be positioned and fixed in place in terms of the vertical direction thereof.

Thus, with the casing structure of the electronic device 100 of the present embodiment, the presence of the cover 30 formed with the coupling protrusions 35 adapted to engage the associated through-bores 11 formed in the printed circuit board 10 enables the printed circuit board 10 to be positioned and fixed in place without a need for positively pressing the printed circuit board 10 as required in the related art. That is, even with the casing structure of the present embodiment, it becomes possible to reduce stress that would be encountered by the printed circuit board 10. Stated another way, the printed circuit board 10 can be supported and fixed in place with no application of overstress needed for the support as in the first embodiment.

Also, the present invention has no intension to limit the number of coupling protrusions 35 to be formed on the cover 30. However, in cases where the trailing edge, closer to the open end of the case 20, of the printed circuit board 10 has a plurality of through-bores 11, the presence of a structure, wherein the cover 30 is provided with a plurality of coupling protrusions 35 (with two pieces being shown in the present embodiment) at positions in compliance with the through-bores 11, enables the printed circuit board 10 to be more firmly fixed than that achieved in a structure formed with a single piece of coupling protrusion 35.

Further, the present embodiment has been shown with reference to an example wherein the printed circuit board 10 is resiliently deformed to create the reaction force by which the distal ends 35b of the coupling protrusions 35 are inserted to the associated through-bores 11 of the printed circuit board 10. However, an alternative may be such that at least one of the printed circuit board 10 and the coupling protrusion 35 is resiliently deformed to create a repulsion force by which the distal ends 35b of the coupling protrusions 35 are inserted to the associated through-bores 11.

Furthermore, the present embodiment has been shown with reference to an example wherein the coupling protrusions are located on the printed circuit board 10 at the lower surface thereof. However, an alternative structure may be adopted with the coupling protrusions located on the printed circuit board 10 at the upper surface thereof.

Moreover, the coupling protrusions 35 may be configured such that under a status wherein the lower surface of the printed circuit board 10 is brought into contact with the lower surface 21b of the guide 21, the boundary area between the connecting portion 35c and the increased diameter portion 35a, forming the coupling protrusion 35, assumes a position lower than the lower surface of the printed circuit board 10. With such a structure, the cover 30 can be easily assembled to the case 20.

Fifth Embodiment

Figure 10:
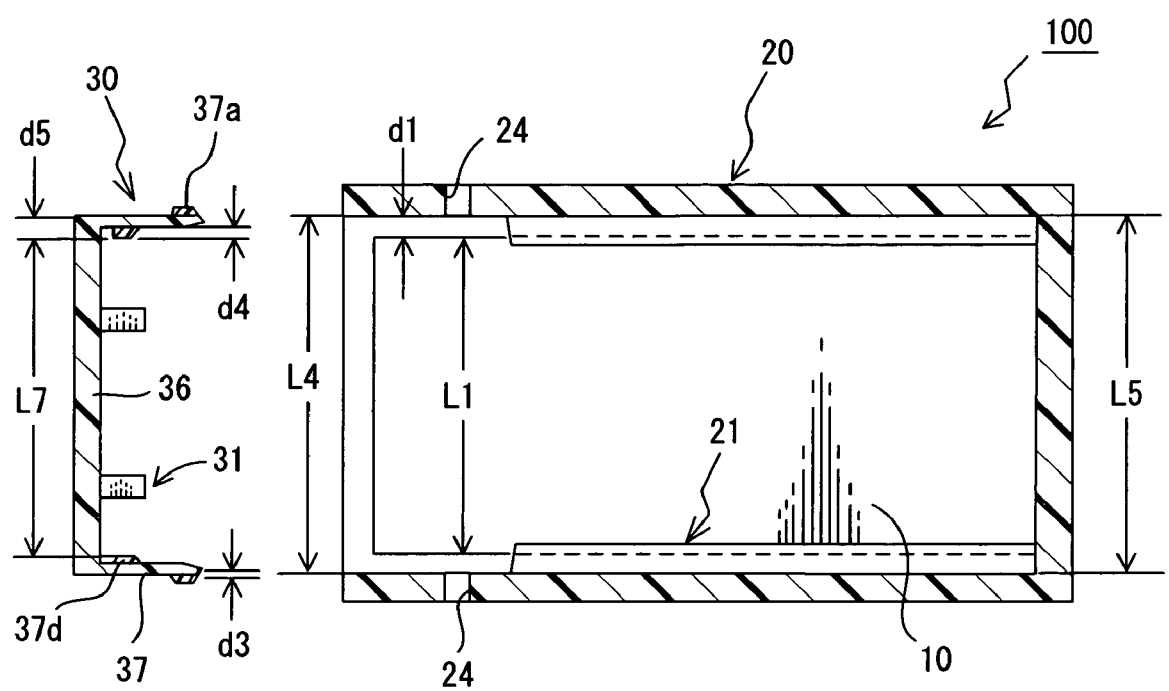
FIG. 10 is a cross-sectional view showing a status, wherein a printed circuit board is inserted to a case, for illustrating a casing structure of a fifth embodiment.
Figure 11A:
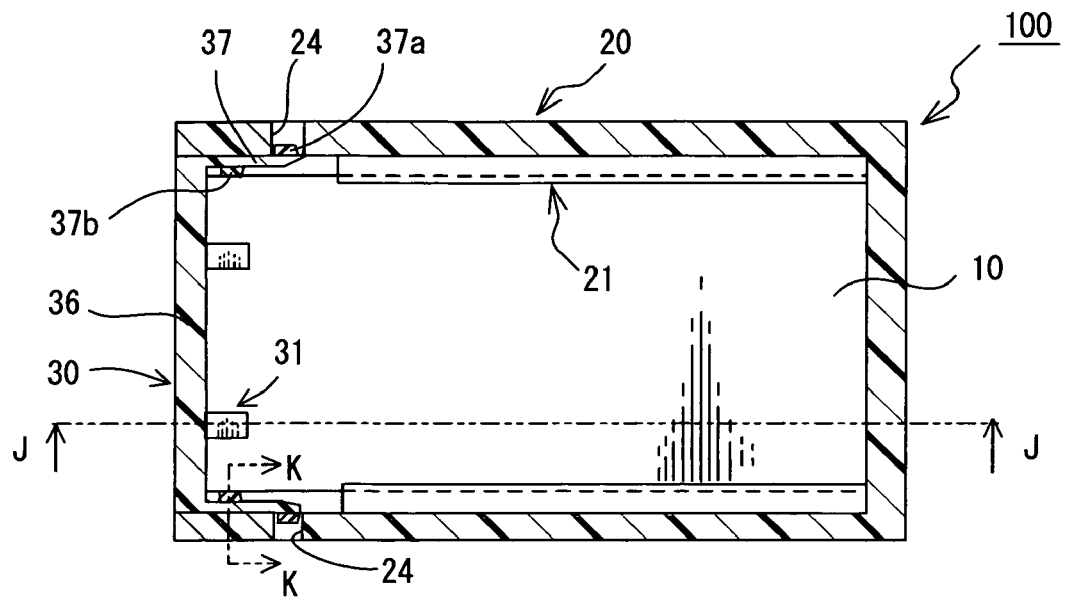
FIGS. 11A and 11C are views showing aft-assembled statuses for illustrating a casing structure of an electronic device of a fifth embodiment.
Figure 11B:
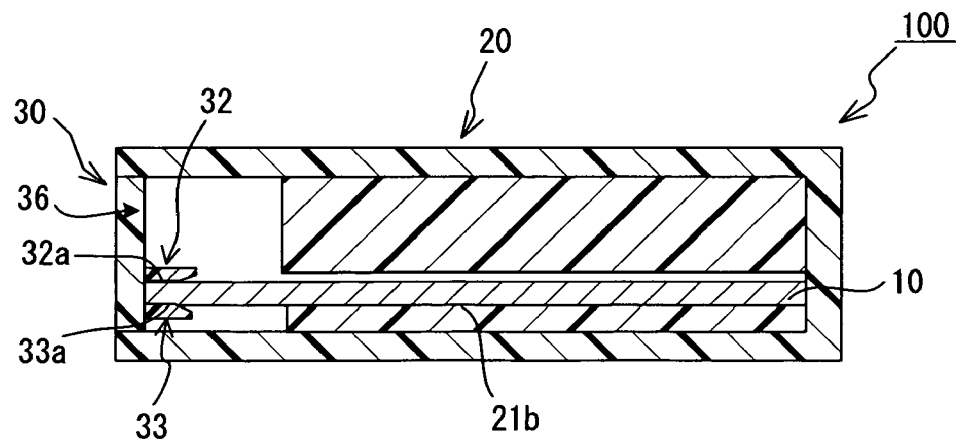
FIG. 11B is a cross-sectional view taken on line J-J of FIG. 11A.
Figure 11C:
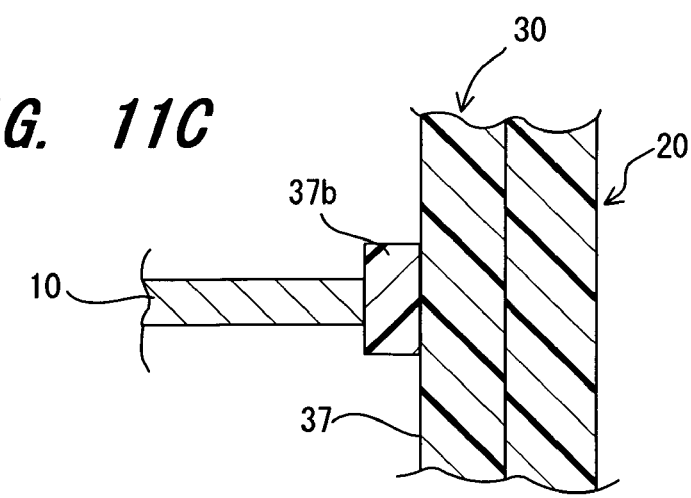

A fifth embodiment according to the present invention will now described in conjunction with FIG. 10, FIGS. 11A and 11C and FIGS.

The casing structure of the electronic device 100 of the fifth embodiment is mostly common in structure to those of the embodiments set forth above and, so, a detailed description of the common component parts is herein omitted to give a description with a focus on differing component parts.

The fifth embodiment differs from the embodiments described above in that the cover 30 includes side portions adapted to be inserted to the gaps d1 to allow the printed circuit board 10 to be positioned and fixed in the planar direction while the case 20 and the cover 30 are fixed to one another at inner areas of the case 20.

As set forth above with reference to the third embodiment, it is a normal practice for the case 20 to have the side surfaces that are not perpendicular to the bottom wall of the case 20 but slightly inclined to be wide at the open end (with an open end width L4 is greater than a rear wall width L5 of the case 20 as shown in FIG. 10). Consequently, with a rectangular printed circuit board 10 being inserted to the case 20, the gap d1 is created between the inner side surface (sidewise inner wall) of the case 20 at the open end thereof and the associated side surface of the printed circuit board. Even with the present embodiment, it is contemplated that the printed circuit board 10 is positioned and fixed in place by utilizing the gap d1.

The case 20 includes coupling aperture portions 24 that are opened at least inward of the case 20 on sidewalls of the case 20 at given positions. With the present embodiment, each coupling aperture portion 24 is formed in a through-aperture and one piece of coupling aperture portion 24 is provided on each surface of the case 20 at an opposing position. With such coupling aperture portions located at opposing positions, the case 20 and the cover 30 are coupled to each other in an increased reliability. Also, each coupling aperture portion is formed to be slightly larger than an associated protrusion to allow the protrusion, described later, to be possibly located in the aperture.

The cover 30 includes a bottom wall portion 36, by which the open end of the case 20 is closed, and a pair of lateral members 37 that are inserted to the gaps d1, created between the internal side surfaces of the case 20 and the side surfaces of the printed circuit board 10 under a condition wherein the printed circuit board 10 is inserted to the case 20 and brought into contact with both of the internal side surfaces of the case 20 and the side surfaces of the printed circuit board 10 to allow the printed circuit board 10 to be positioned and fixed in the planar direction under a condition wherein the open end of the case 20 is closed at least by the bottom wall portion 36 (with the cover 30 being assembled to the case 20). Also, the bottom wall portion 36 corresponds to a flat portion, defined in appended claims, and that shown in conjunction with the other embodiments.

The lateral members 37 include outward positioning protrusions 37a engageable with the associated coupling aperture portions 24, respectively, formed in the case 20 at positions closer to the open end thereof under a condition where the outward positioning protrusions 37a are inserted to the gaps d1, respectively, to cause the bottom wall portion 36 to close the open end of the case 20. With the present embodiment, further, the lateral members 37 are formed with inward positioning protrusions 37b that protrude in directions opposite to the outward positioning protrusions 37a, respectively, to serve as means for positioning the printed circuit board 10 in terms of the planar direction.

With the present embodiment, the outward positioning protrusion 37a and the inward positioning protrusion 37b are made of the same material as that of the cover 30 to be integral with the lateral member 37. Moreover, the inward positioning protrusions 37b are formed on a pair of lateral members 37 at opposing positions, respectively. Such a structure results in improvement over connecting reliability between the case 20 and the cover 30.

It is set such that the inward positioning protrusion 37b has a width d4 (corresponding to a height of the protrusion extending from a base of the lateral member 37) that is substantially equal to or greater than a width d3 (corresponding to a height of the protrusion extending from the base of the lateral member 37) of the outward positioning protrusion 37a and a width d5 (inclusive of the inward positioning protrusion 37b) of the lateral member 37, at the area in which the inward positioning protrusion 37b is formed, is substantially equal to the gap d1. With the present embodiment, the inward positioning protrusion 37b has a width d4 that is slightly greater than the width d3 of the outward positioning protrusion 37a.

With such a structure, although the outward positioning protrusions 37a, formed on the respective lateral members 37, takes structures to engage the coupling aperture portions 24 through the gaps d1, respectively, the presence of the areas at which the inward positioning protrusions 37b of the respective lateral members 37 enables the printed circuit board 10 to be positioned in terms of the planar direction thereof. Also, in addition to the structure set forth above, another structure may be provided in a structure such that the lateral members 37, which have respective outward positioning protrusions 37a, have leading insertion ends each with a narrow width while the lateral members 37 have rear ends formed in thick configurations, respectively. This results in structure by which the printed circuit board 10 can be positioned in the planar direction without a need to provide the inward positioning protrusions 37b.

Further, the width d3 of the outward positioning protrusion 37a is set to be smaller than a width (a depth of the associated through-aperture formed as the coupling aperture portion 24) on the side of the case 20. With such a structure, the outward positioning protrusions 37a do not protrude from outer side faces (at outer walls of the respective sides) of the case 20 under a condition where the outward positioning protrusions 37a engage the associated coupling aperture portions 24, respectively, enabling improvement in connecting reliability between the case 20 and the cover 30 even with the use of the through-apertures.

In addition, a distance L7 between the inward positioning protrusions 37b of the pair of lateral members 37 in contact with the side surfaces of the printed circuit board 10 is set to be substantially equal to the width L1 of the printed circuit board 10. Therefore, the lateral members 37 are brought into contact with both the side surfaces of the printed circuit board 10 and the side surfaces of the case 20 at the positions at which the inward positioning protrusions 37b are formed, enabling the printed circuit board 10 to be positioned in place in terms of the planar direction thereof.

Further, the cover 30 includes vertically positioning members 31, which are provided on at least one of the bottom wall portion 36 and the lateral members 37 to pinch the end of the printed circuit board 10 at both the upper and lower surfaces thereof with a width substantially equal to the thickness t1 of the printed circuit board 10, under a condition where the open end of the case 20 is closed by the bottom wall portion 36. This allows the printed circuit board 10 to be positioned in the vertical direction.

With the present embodiment, each vertically positioning member 31 is comprised of the vertically positioning upper segment 32, protruding from the bottom wall portion 36 and adapted to be brought into contact with the upper surface of the printed circuit board 10, the vertically positioning lower segment 33 adapted to be brought into contact with the lower surface of the printed circuit board 10, and the inner wall of the cover 30 like the first embodiment. It is set such that under a status where the cover 30 is assembled to the case 20, the surface of the pinch portion 33a of the vertically positioning lower segment 33 is aligned on the same height (on the same plane) with the lower surface 21b of the guide 21. Also, the vertically positioning members 31, each comprised of the vertically positioning upper segment 32 and the vertically positioning lower segment 33, are provided in a pair at positions symmetric with respect to the center of the short side of the printed circuit board 10 formed in the rectangular configuration.

Figure 12A:
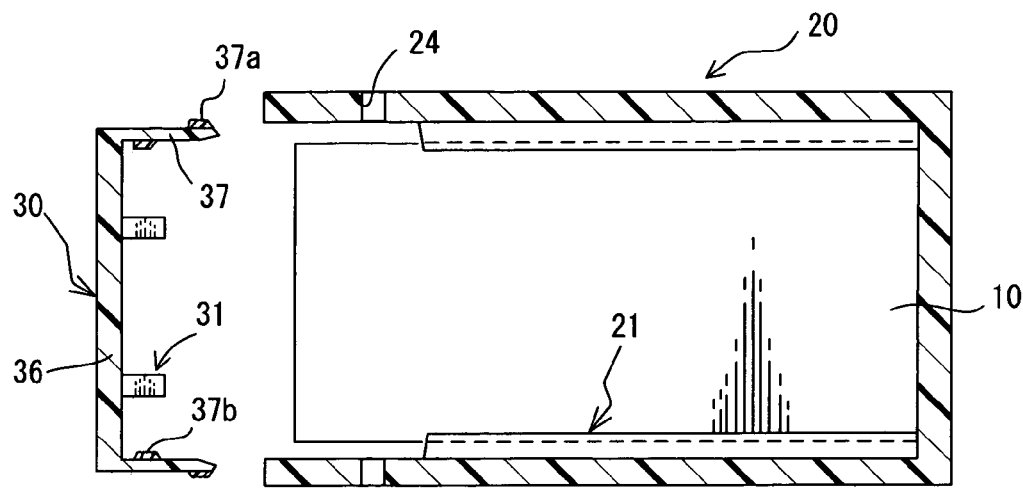
FIGS. 12A to 12C are views for illustrating the casing structure of the electronic device of the fifth embodiment.
Figure 12B:
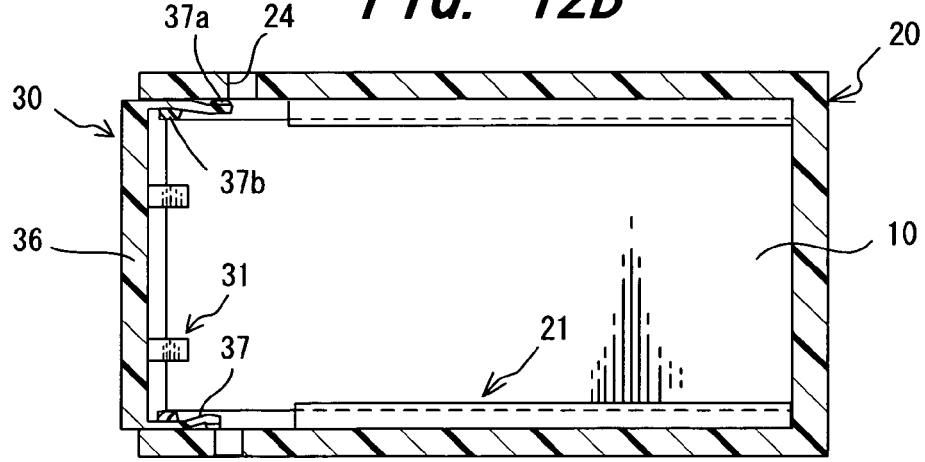
Figure 12C:
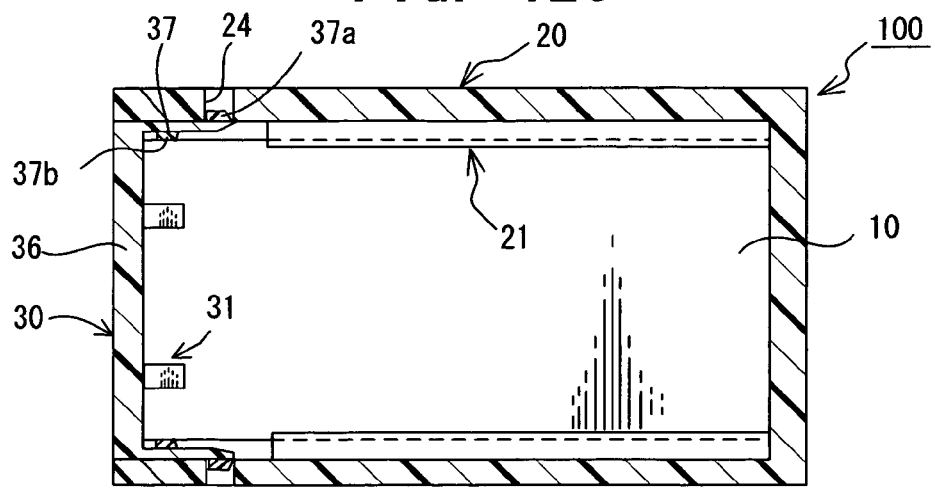

The cover 30, formed in such a structure, is assembled to the case 20 in a sequence shown in FIGS. 12A to 12C. Also, the lateral members 37 have insertion distal ends, respectively, (inclusive of the outward positioning protrusion 37a), each of which is formed in a tapered shape to be easily inserted to the case 20 and a width between the insertion distal ends of the pair of the lateral members 37 are set to be slightly less than the width L4 of the open end of the case 20.

First, the lateral members 37 of the cover 30 are inserted to the gaps d1, created between the inner side surfaces of the case 20 and the side surfaces of the printed circuit board 10, under a condition where the printed circuit board 10 is accommodated inside the case 20 along the guides 21 as shown in FIG. 12A. When this takes place, the respective tapered insertion sides of the outward positioning protrusions 37a get on the inner side surfaces of the case 20 to cause the lateral members 37 to be resiliently deformed in a manner as shown in FIG. 12B. Under such resiliently deformed statuses, the cover 30 is inserted to the rear area of the case 20 in a further extent, the inward positioning protrusions 37b of the lateral members 37 are also inserted to the gaps d1, respectively.

Then, as the cover 30 is further inserted toward the rear side of the case 20 to a position (under a status wherein with the present embodiment, an outer wall of the bottom wall portion 36 is placed to be coplanar with the end of the case 20) in which the bottom wall portion 36 closes the open end of the case 20, the outward positioning protrusions 37a reach the coupling aperture portions 24 of the case 20, respectively, in positions at which the outward positioning protrusions 37a are coupled with the coupling aperture portions 24, respectively, due to reaction forces of the resiliently deformed lateral members 37. Thus, the cover 30 is fixedly secured (assembled) to the case 20.

Under such a fixed condition, the lateral members 37 of the cover 30 are brought into contact with both the internal side surfaces of the case 20 and the side surfaces of the printed circuit board 10 at the areas in which the inward positioning protrusions 37b are formed, thereby causing the printed circuit board 10 to be positioned in place in terms of the planar direction thereof.

The vertically positioning members 31, provided on the bottom wall portion 36 of the cover 30, causes the printed circuit board 10 to be positioned and fixed in place in terms of the vertical direction thereof. Therefore, the printed circuit board 10 can be positioned and fixed in place with no external force positively applied thereto as required in the related art. That is, even with the casing structure of the present embodiment, it becomes possible to reduce stress that would be encountered by the printed circuit board 10. Stated another way, the printed circuit board 10 can be supported and fixed in place with no application of overstress needed for the support as in the first embodiment.

With the present embodiment, the lateral members 37, forming the cover 30, are inserted to the gaps d1 between the inner side surfaces of the case 20 and the side surfaces of the printed circuit board 10 to cause the outward positioning protrusions 37a, formed on the lateral members 37, respectively, to engage the coupling aperture portions 24, which are opened at least to the interior of the case, thereby permitting the cover 30 to be assembled to the case 20. Consequently, the fixing areas between the case 20 and the cover 30 are located inside the case 20, resulting in improvement in connecting reliability between the case 20 and the cover 30.

Further, the lateral members 37 are provided on the bottom wall portion 36 in the pair and include the outward positioning protrusions 37a, respectively, for engagement. Accordingly, the cover 30 is fixedly secured to the case 20 on the both sides thereof, enabling further improvement in connecting reliability between the case 20 and the cover 30.

The present embodiment has also been shown in conjunction with an example wherein the coupling aperture portions 24 are formed of through-apertures, respectively. However, the coupling aperture portions 24 are not limited to such exemplary configurations and may be formed in concave shapes to allow the outward positioning protrusions 37a to be brought into engagement with the coupling aperture portions 24, respectively.

The present embodiment has also been shown in conjunction with an example wherein the vertically positioning members 31 are provided on the bottom wall portion 36 of the cover 30 and each comprised of the vertically positioning upper segment 32, adapted to be brought into contact with the upper surface of the printed circuit board 10, the vertically positioning lower segment 33, adapted to be brought into contact with the lower surface of the printed circuit board 10, and the inner surface of the cover 30. However, it may be sufficed for the vertically positioning members 31 to be provided on at least one of the bottom wall portion 36 and the lateral members 37.

Thus, the vertically positioning members 31 may be provided on the lateral members 37, respectively, or may be provided on the bottom wall portion 36 and the lateral members 37, respectively. Also, another alternative structure may be such that the vertically positioning upper segment 32 and the vertically positioning lower segment 33 are provided in different positions in the planar direction of the printed circuit board 10.

Figure 13:
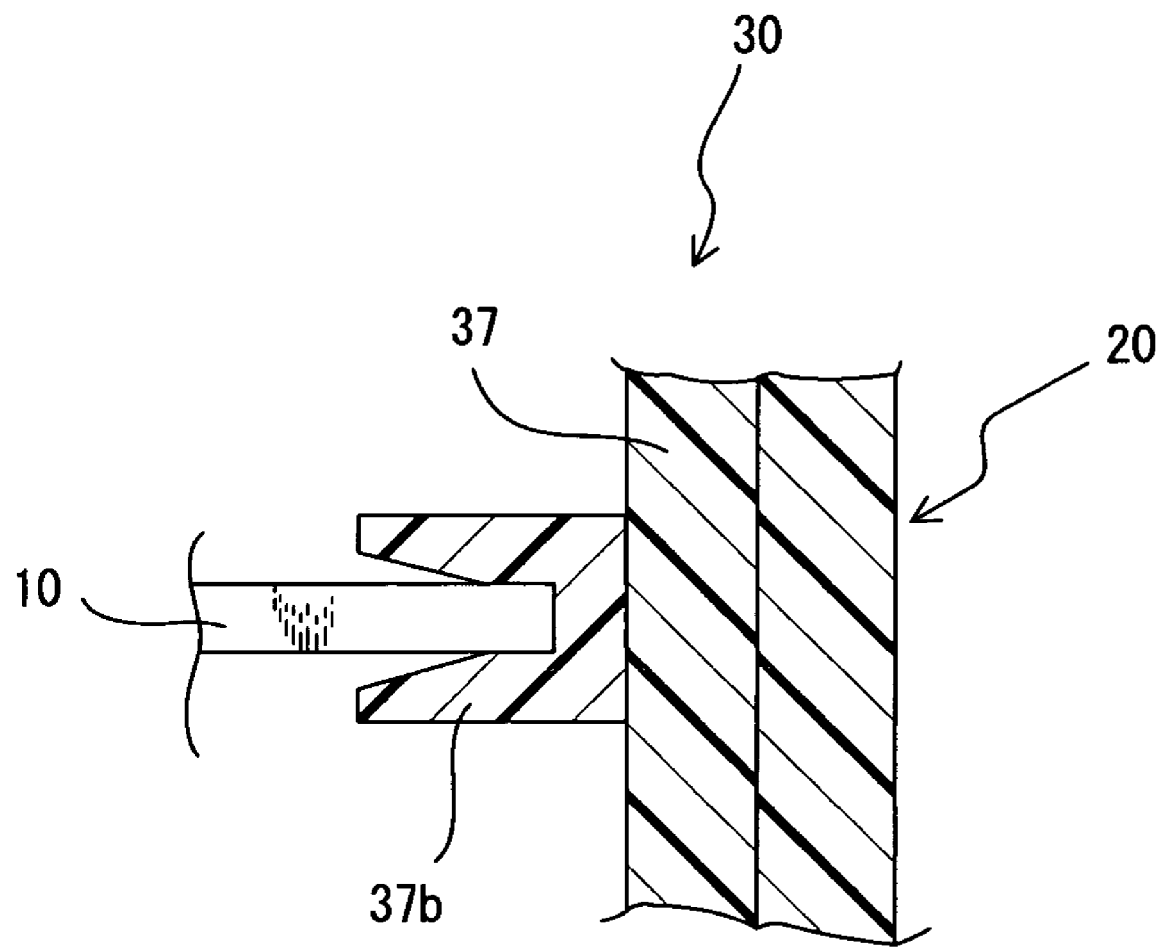
FIG. 13 is a view showing a modified form of the fifth embodiment.

For instance, in a case where the vertically positioning members 31 are provided on the lateral members 37, respectively, forming the inward positioning protrusions 37b in concave shapes, respectively, as shown in FIG. 13 enables the provision of a structure to cause the inward positioning protrusions 37b to position the printed circuit board 10 in terms of the planar direction thereof while permitting the inward positioning protrusions 37b to serve as the vertically positioning member 31 to be brought into contact with the upper and lower surfaces of the printed circuit board 10 to position the same in the vertical direction. In such a case, the vertically positioning members 31 on the bottom wall portion 36 may be dispensed with. FIG. 13 is a view showing a modified form of the present embodiment.

Further, the presence of the inward positioning protrusions 37b each formed in an L-shaped configuration (not shown) enables the provision of a structure to allow the inward positioning protrusions 37b to be formed as parts (as the vertically positioning upper segments 32 or the vertically positioning lower segment 33) of the vertically positioning member 31. In such a case, it is so structured that both the pair of the inward positioning protrusions 37b are formed in the L-shape configurations with one serving as the vertically positioning upper segments 32 while the other one serves as the vertically positioning lower segment 33. Also, another alternative structure may be such that the printed circuit board 10 is positioned in terms of the vertical direction thereof in combination with at least a part of each vertically positioning member 31 provided on the bottom wall portion 36.

While the present embodiments have been described above, the present invention is not limited to only such embodiments discussed above and a variety of modifications may be possible to be carried out.

The positioning fixture sections, shown in the first to fifth embodiments set forth above, may be combined in various other structures than those set forth above with reference to the first to fifth embodiments. For instance, it is so structured that the structure of the first embodiment may additionally include the gap adjusters 34 and the coupling protrusions 35 to allow the printed circuit board 10 to be further firmly fixed in place.

Further, the present embodiment has been shown in conjunction with an example wherein both the case 20 and the cover 30 are made of resin material. In cases where the case 20 and the cover 30 are made of resin material, the electronic device 100 can be manufactured in lightweight. On the contrary, the electronic device 100 has less strength further liable to suffer from deformation than those in which the case 20 and the cover 30 are made of metal.

Even with the case 20 and the cover 30 made of resin material with such less strength, the electronic device 100 is formed in the casing structure set forth above, enabling the provision of the electronic device with increased rigidity and excellent assembling capability. Thus, the casing structure of the electronic device 100, set forth above, is suitable particularly when the case 20 and the cover 30 are made of resin material, but the present invention is not limited to such material and may be effective even for the structure made of metallic material.

Furthermore, with the present embodiment, the casing structure of the electronic device 100 has been shown with reference to an example as applied to the casing structure of the electronic device of an engine ECU of the vehicle. In addition to a need for the engine ECU of the vehicle to have lightweight, the engine ECU needs to have increased rigidity due to increased vibrations being applied from the vehicle. The presence of the casing structure, set forth above, which is used for such an engine ECU enables the engine ECU to have increased rigidity and excellent assembling capability. Thus, while the casing structure of the electronic device 100 mentioned above may be suitably applied to the engine ECU of the vehicle, the present invention is not limited to such an application and may be effectively employed in electronic devices in arbitrary applications.

The present invention may be embodied in several other forms without departing from the spirit thereof. The present embodiments as described is therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A casing unit for accommodating therein a printed circuit board having a planar direction extending therealong, a vertical direction perpendicular to the planar direction, and an upper surface and a lower surface extending along the planar direction, electronic component parts being mounted on at least one of the upper and lower surfaces, the casing unit comprising:

a case having a plurality of walls including one wall which is partially or entirely open to form an opening through which the printed circuit board is inserted into the case and two side walls each intersecting the opening and being parallel with an insertion direction alone which the printed circuit board is inserted;

a guide member composed of two guides respectively secured on the side walls inside the case, the two guides providing a path therealong to guide the printed circuit board to be inserted into the case along the insertion direction;

a cover applied to the case so as to cover the opening of the case after inserting the printed circuit board into the case from the opening of the case alone the path;

a first positioning member being provided on a part of each of the two guides, which is positioned farthest in the insertion direction, and positioning the printed circuit board inserted in the case in the planar direction by coming in contact with part of each, side of the printed circuit board; and a second positioning member being provided on the cover and positioning the printed circuit board in a the vertical direction by coming into contact with at least one of the upper surface and the lower surface of the printed circuit board in the vertical direction.

2. The casing unit according to claim 1, wherein both the case and the cover are made of a resin material.

3. The casing unit according to claim 1, wherein the electronic component parts are mounted on the printed circuit board compose circuitry dedicated to an electronic control unit (ECU) for an automobile engine.

4. A casing unit for accommodating therein a printed circuit board having a planar direction extending therealong, a vertical direction perpendicular to the planar direction, and an upper surface and a lower surface extending along the planar direction, electronic component parts being mounted on at least one of the upper and lower surfaces, the casing unit comprising:

a case having a plurality of walls including one wall which is partially or entirely open to form an opening through which the printed circuit board is inserted into the case and two side walls each intersecting the opening and being parallel with an insertion direction along which the printed circuit board is inserted;

guides, which are secured on tile side wails inside the case and provide a path therealong to guide the printed circuit board to be inserted into the case along the insertion direction, comprising two guide protruding members each formed to protrude from part of each of the side walls into the path and positioned farthest in the insertion direction so that the two guide protruding members partly come in contact with both sides of the printed circuit board to be inserted into the case along the path so that the printed circuit board is positioned in place in the planar direction in the case; and a cover, which is applied to the case so as to cover the opening of the ease after inserting the printed circuit board into the case from the opening of the case along the path, comprising a vertically positioning member being provided on the cover and positioning the printed circuit board in the vertical direction by pinching an end of the printed circuit board in the vertical direction, the end of the printed circuit board being located in the opening of the case in which the printed circuit board is positioned in the planar direction by the guide protruding members.

5. The casing unit according to claim 4, wherein each of the guide protruding members comprises:

a slope sloped to gradually come close to each of the sides of the printed circuit board as the insertion of the printed circuit board advances in the insertion direction along the path and a retainer formed to be continuous from the slope, both of the retainers of the guide protruding members being faced to each other to have a distance therebetween which is substantially equal to a width of the printed circuit board.

6. The casing unit according to claim 5, wherein the vertically positioning member has a recess to pinch the end of the printed circuit board, the recess being open to the case when the cover is applied to the case and having a gap length substantially equal to a thickness of the printed circuit board.

7. The casing unit according to claim 6, wherein each of the retainers is formed to have a surface contact with each of the sides of the printed circuit board.

8. The casing unit according to claim 6, wherein each of the retainers is formed to have a point contact with each of the sides of the printed circuit board.

9. The casing unit according to claim 8, wherein each of the guide protruding members is formed into a semi-spherical shaped protrusion.

10. The casing unit according to claim 6, wherein the guide protruding members are positioned directly face to face on both of the side walls of the case.

11. The casing unit according to claim 6, wherein, the vertically positioning member is formed to have a recess that opens to the printed circuit board when the cover is applied to the case.

12. The casing unit according to claim 11, wherein the vertically positioning member is formed to have portions which contact the upper surface and the lower surface of the printed circuit board, respectively, the contact portions being different from each other in positions in the planar direction.

13. The casing unit according to claim 12, wherein the vertically positioning member is formed to have three portions, one of which contacts the lower surface of the printed circuit board at a substantially central position of the end located in the opening in a width direction, of the printed circuit board and the remaining two of which contacts the upper surface of the printed circuit board at two positions of the end located in the width direction, the central position being at a substantially center of the two positions.

14. The casing unit according to claim 6, wherein the vertically positioning member is formed to have a portion contacting the lower surface of the printed circuit board in cases where the cover is applied to the case, the contacted portion being the same in level in the vertical direction, as a lower surface of each of die guides which defines a lower side of the path.

15. A casing unit for accommodating therein a printed circuit board having a planar direction extending therealong, a vertical direction perpendicular to the planar direction, and an upper surface and a lower surface extending along the planar direction, electronic component parts being mounted on at least one of the upper and lower surfaces, the casing unit comprising:

a case having a plurality of walls including one wall which is partially or entirely open to form an opening through which the printed circuit board is inserted into the case and two side walls each intersecting the opening and being parallel with an insertion direction along which the printed circuit board is inserted;

a pair of guides secured respectively on the two side walls inside the case to provide a path guiding the printed circuit board to be inserted into the case along the insertion direction, each guide comprising:

a first guide protruding member formed to partly protrude into the path and positioned farthest in the insertion direction to partly come in contact with one of both sides of the printed circuit board to be inserted into the case along the path, so that the printed circuit board is positioned in place in the planar direction in the case, and a second protruding member formed to partly protrude into the path and positioned farthest in the insertion direction to partly come in contact with at least one of the upper surface and the lower surface of the printed circuit board to be inserted into the case along the path, so that the printed circuit board is positioned in the vertical direction; and a cover to be applied to the case to cover the opening of the case after inserting the printed circuit board into the case from the opening of the case along the path.

16. The casing unit according to claim 15, wherein the first guide protruding member comprises:

a first slope sloped to gradually come close to each of the sides of the printed circuit board as the insertion of the printed circuit board advances along the path and a first retainer formed to be continuous from the first slope, both first retainers of the first guide protruding members of the guides being faced to each other to have a distance therebetween which is substantially equal to a width of the printed circuit board.

17. The casing unit according to claim 16, wherein the second guide protruding member comprises:

a second slope sloped to gradually come close to at least one of the upper and lower surfaces of the printed circuit board as the insertion of the printed circuit board advances along the path, and a second retainer formed to be continuous from the second slope, both second retainers of the second guide protruding members of the guides being faced to each other to have a distance therebetween which is substantially equal to a thickness of the printed circuit board.

18. The casing unit according to claim 17, wherein the first retainer is formed to have a surface contact with each of the sides of the printed circuit board.

19. The casing unit according to claim 17, wherein the first retainer is formed to have a point contact with each of the sides of the printed circuit board.

20. The casing unit according to claim 19, wherein the first guide protruding retainer is formed into a semi-spherical, shaped protrusion.

21. The casing unit according to claim 17, wherein the two first guide protruding members of the guides are positioned face to face on the two side walls of the case, respectively.

22. The casing unit according to claim 17, wherein the second retainer is formed to have a surface contact with at least one of the upper and lower surfaces of the printed circuit board.

23. The casing unit according to claim 17, wherein the second retainer is formed to have a point contact with at least one of the upper and lower surfaces of the printed circuit board.

24. The casing unit according to claim 23, wherein the second guide protruding member is formed into a semi-spherical shaped protrusion.

25. The casing unit according to claim 17, wherein the first guide protruding member and the second guide protruding members formed as a single unit.

26. A casing unit for accommodating therein a printed circuit board having a planar direction extending therealong, a vertical direction perpendicular to the planar direction, and an upper surface and a lower surface extending along the planar direction, electronic component parts being mounted on at least one of the upper and lower surfaces, the casing unit comprising:

a case having a plurality of walls including one wall which is partially or entirely open to form an opening through which the printed circuit board is inserted into the case and two side walls each intersecting the opening and being parallel with an insertion direction along which the printed circuit board is inserted;

guides secured on the two side wails inside the case to provide a path guiding the printed circuit board to be inserted into the case along the insertion direction; and a cover, which is applied to the case to cover the opening of the case, comprising:

planar-direction positioning members positioning the printed circuit board in the planar direction and being respectively inserted into spaces each formed between each of the two side walls of the case and each of sides of the printed circuit board along the path, when the printed circuit board is inserted into the case along the path, whereby the planar-direction positioning members are made to contact both the side walls of the case and the sides of the printed circuit board, and a vertically positioning member positioning the printed circuit board in the vertical direction perpendicular, when the cover is applied to the case to cover the opening, by pinching an end of the printed circuit board in the vertical direction, the end of the printed circuit board being located in the opening of the case in which the printed circuit board is positioned in the planar direction by the planar-direction positioning members.

27. The casing unit according to claim 26, wherein the planar-direction positioning members are protruded from the cover, and the vertically positioning member has a recess to pinch an upper and lower surfaces of an end of the printed circuit board existing in the opening when the printed circuit board is inserted into the case along the path, the recess being open to the case when the cover is applied to the case and having a gap length substantially equal to a thickness of the printed circuit board.

28. The casing unit according to claim 27, wherein
the planar-direction positioning members are composed of a pair of members inserted into the spaces respectively and a distance between the pair of members is substantially the same in a width of the printed circuit board.

29. The casing unit according to claim 28, wherein
the vertically positioning member is formed to have a recess opening to the printed circuit board when the cover is applied to the case.

30. The casing unit according to claim 29, wherein
the vertically positioning member is formed to have portions which contact an upper surface and a lower surface of the printed circuit board, respectively, the contact portions being different from each other in positions in the planar direction.

31. The casing unit according to claim 30, wherein the vertically positioning member is formed to have three portions, one of which contacts the lower surface of the printed circuit board at a substantially central position of the end located in the opening in a width direction of the printed circuit board and the remaining two of which contacts the upper surface of the printed circuit board at two positions of the end located in the width direction the central position being at a substantially center of the two positions.

32. The casing unit according to claim 27, wherein the vertically positioning member is formed to have a portion contacting a lower surface of the printed circuit board in cases where the cover is applied to the case, the contacted portion being the same in level in the vertical direction as a lower surface of each of the guides which defines a lower side of the path.

33. A casing unit for accommodating Therein a printed circuit board having a planar direction extending therealong, a vertical direction perpendicular to the planar direction, and an upper surface and a lower surface extending along the planar direction, electronic component parts being mounted on at least one of the upper and lower surfaces, the casing unit comprising:

a case having a plurality of walls including one wall which is, partially or entirely open to form an opening through which the printed circuit board is inserted into the case and two side walls each intersecting the opening and being parallel with an insertion direction along which the printed circuit board is inserted;

guides, which are secured on the two side walls inside the case, providing a path guiding the printed circuit board to be inserted into the case and having surfaces to which the printed circuit board to be inserted into the case along the path is touched so that the printed circuit board is positioned in a the vertical direction;

a cover to be applied to the case to cover the opening of the case; and a coupling protrusion secured on the cover and formed to include an increased diameter portion positionally corresponding to a through-bore formed trough the printed circuit board and having a diameter which is not less tan a diameter of the through-bore, a distal end portion insertable into the through-bore, and a tapered connecting portion rigidly connecting the increased diameter portion and the distal end portion, whereby, when the cover is applied to the case, the distal end portion is inserted in the through-bore to be fit so that the printed circuit board is positioned in the planar direction.

34. The easing unit according to claim 33, wherein the coupling protrusion is an L-shaped member protruded from a wall portion of the cover, the wall portion facing the opening of the case when the cover is applied to the case, the L-shaped member including the increased diameter portion, the tapered connecting portion, and the distal end portion.

35. The casing unit according to claim 34, wherein the bore-hole is composed of a plurality of holes and the coupling protrusion is composed of a plurality of protrusions inserted in the plurality of bore-holes, respectively.

36. A casing unit for accommodating therein a printed circuit board having a planar direction extending therealong, a vertical direction perpendicular to the planar direction, and an upper surface and a lower surface extending along the planar direction, electronic component parts being mounted on at least one of the upper and lower surfaces, the casing unit comprising:

a case i) having a plurality of walls including one wall which is partially or entirely open to form an opening through which the printed circuit board is inserted into the case and two side walls each intersecting the opening and being parallel with an insertion direction along which the printed circuit board is inserted and ii) having coupling aperture portions formed in the two side walls so as to, at least, open toward an inside of the ease;

guides secured on the two side walls inside the case to provide a path guiding the printed circuit board to be inserted into the case along the insertion direction; and a cover, which is applied to the case to cover the opening of the case, comprising:

a plate covering the opening of the case, a pair of planar-direction positioning members positioning the printed circuit board in the planar direction, the positioning members being secured to the plate, respectively inserted into spaces each formed between each of the side walls of the case and each of sides of the printed circuit board along the path, when the printed circuit board is inserted into the case along the path, and each formed to have outward positioning protrusions to be fit with the coupling aperture portions of the two side walls of the case, whereby each of the positioning members is made to contact both each of the two side walls of die case and each of the sides of the printed circuit board, and a vertically positioning member, which is secured to at least one of the plate and the planar-direction positioning members, positioning the ease-inserted printed circuit board in the vertical direction by pinching an end of the printed circuit board alone the planar direction, the end of the printed circuit board being located at the opening of the case in which the printed circuit board is positioned in the planar direction by the planar-direction positioning members.

37. The casing unit according to claim 36, wherein the vertically positioning member has a recess to pinch the end of the printed circuit board, the recess being open to the case when the cover is applied to die case and having a gap length substantially equal to a thickness of the printed circuit board.

38. The casing unit according to claim 36, wherein the coupling aperture portions in the two side walls are mutually opposed in a direction along the path.

39. The casing unit according to claim 38, wherein the coupling aperture portions are through-bores each passing through each of the two side walls, and each of the outward positioning protrusions of the planar-direction positioning members has a height allowing each outward positioning protrusion to be within each through-bore.

40. The casing unit according to claim 36, wherein each of the pair of planar-direction positioning members has an inner positioning protrusion positioning the printed circuit board in the planar direction through a contact with a side of the printed circuit board, when die outward positioning protrusions on the planar-direction positioning members are fit in the coupling aperture portions.

41. The casing unit according to claim 40, wherein the inward positioning protrusions on the planar-direction positioning members are opposed to each other in a direction along the path.

42. The casing unit according to claim 40, wherein the inward positioning protrusion on each of the planar-direction positioning members has a height equal to or higher than the outward positioning protrusion on each of the planar-direction positioning members.

43. The casing unit according to claim 40, wherein the inward positioning protrusion on each of the planar-direction positioning members is configured to position the printed circuit board in the planar direction and to perform part of the vertically positioning member by contacting at least one of an upper surface and a lower surface of the end of the printed circuit board.

44. The casing unit according to claim 36, wherein the vertically positioning member is formed to have a recess opening to the printed circuit board when the cover is applied to the opening of the ease.

45. The casing unit according to claim 36, wherein the vertically positioning member is formed to have portions which contact an upper surface and a lower surface of the printed circuit board, the contact portions being different from each other in positions in the planar direction.

46. The casing unit according to claim 36, wherein the vertically positioning member is formed to have a portion contacting a lower surface of the printed circuit board in cases where the cover is applied to the case so that the plate of the cover covers the opening of the case, the contacted portion being the same in level in the vertical direction as a lower surface of each of the guides which defines a lower side of the path.

* * * * *